United States Patent [19]
Tashiro et al.

[11] Patent Number: 5,153,758
[45] Date of Patent: Oct. 6, 1992

[54] DRIVING METHOD AND APPARATUS FOR A PNPN SEMICONDUCTOR DEVICE

[75] Inventors: Yoshiharu Tashiro; Kenichi Kasahara; Takahiro Numai, all of Tokyo, Japan

[73] Assignee: NEC Corporation, Tokyo, Japan

[21] Appl. No.: 692,850

[22] Filed: Apr. 29, 1991

[30] Foreign Application Priority Data

Apr. 27, 1990 [JP] Japan ............................ 2-113612
May 15, 1990 [JP] Japan ............................ 2-124373
Jun. 26, 1990 [JP] Japan ............................ 2-167001

[51] Int. Cl.$^5$ ............................................. H04J 14/02
[52] U.S. Cl. ............................................ 359/124; 372/43; 250/213 A
[58] Field of Search ............... 250/213 A; 307/311, 307/324; 359/124, 158, 173; 357/17, 30, 38; 372/43

[56] References Cited

U.S. PATENT DOCUMENTS

| | | | |
|---|---|---|---|
| 4,864,168 | 9/1989 | Kasahara et al. | 307/311 |
| 4,952,028 | 8/1990 | Tashiro | 250/213 A |
| 5,059,788 | 10/1991 | Tashiro et al. | 250/213 A |
| 5,065,044 | 11/1991 | Kasahara et al. | 307/311 |

Primary Examiner—Edward L. Coles, Sr.
Assistant Examiner—Kinfe-Michael Negash
Attorney, Agent, or Firm—Sughrue, Mion, Zinn, Macpeak & Seas

[57] ABSTRACT

A driving method for a pnpn semiconductor device includes the steps of applying a voltage higher than a holding voltage of the pnpn semiconductor device to an anode electrode thereof, supplying a control signal light to the pnpn semiconductor device to set the pnpn semiconductor device into an ON state, and supplying an information signal light to the pnpn semiconductor device to emit an output light. The control signal light and the information signal light are time-sequentially supplied to the pnpn semiconductor device under the voltage applied thereto. An apparatus for carrying out the driving method includes a light information transmission input line that is branched into a plurality of lines, where a light detection circuit is coupled to at least one of the lines. A synchronous driving circuit applies voltage to the pnpn semiconductor device which is coupled to one of the other lines of the information transmission input line. The pnpn semiconductor device is driven by receiving light from the input line when the light detection circuit detects an address of the pnpn semiconductor device included in a light supplied from the light information transmission input line.

11 Claims, 20 Drawing Sheets

DRIVING METHOD AND APPARATUS FOR A PNPN SEMICONDUCTOR DEVICE

FIELD OF THE INVENTION

The present invention relates to driving method and apparatus of a pnpn semiconductor device, and more particularly to, a method and an apparatus for driving a pnpn semiconductor device which is used for an optical information processing system, an optical exchanging system, etc.

BACKGROUND OF THE INVENTION

Integrated circuits have been increasingly made more highly large-scale-integrated, and a device having a capacity of 16 Mbits has been developed. Miniaturization and improvement in the switching speed of each electronic element of the integrated circuit has made remarkable progress. However, as progress has been made in making a device more highly-integrated, interconnections in the device have become highly dense and more complicated. Consequently, a stray capacity has been increased, and therefore a signal propagation speed has been limited accordingly. As a result, despite the high switching speed of the electronic devices, an actual operation speed of the integrated circuit is limited by the signal propagation speed. Accordingly, a so-called optical connection, in which light is used for signal transmission among electronic devices, has been proposed to overcome the above problem.

The optical connection is a connection of electric signals to be realized by using optical interconnection. In other words, electric interconnection is not used therein. In the optical interconnection, the signal propagation speed only depends on the refractive index and the line length, and is not affected by the capacitive impedance. In addition, little cross talk occurs in the lines, even if the lines are proximate to each other, because optical lines are non-inductive, so that no limitation occurs in connection density due to the non-existence of induction. Even more, it is possible to connect optical lines in intersecting pattern. When optical lines are spatially connected, complicated interconnection becomes unnecessary and two or three-dimensional interconnection (parallel connection) can be realized. Additionally, connection density is much increased by using wavelength multiplexing, etc.

Further, optical functional connecting systems have been proposed, in which highly developed signal processing can be realized by not merely using light for signal connection, but by adding optical processing function to the above optical connection. In order to realize optical signal processing systems, optical exchanging systems, etc. in addition to optical connection, devices which are sufficiently compact, consume a small amount of power, and have precisely designable and reproducible performance characteristics are required. For this purpose, a vertical to surface transmission electrophotonic device (abbreviated VSTEP hereinafter) having functions such as light emission, light receiving, memory, threshold, etc., as reported by Tashiro et al. on pp. 329-331, in "Appl. Phys. Lett. 54(4), Jan. 23, 1989" has been proposed. The VSTEP is a device having a pnpn structure which emits a light responsive to a small-power trigger light, when a predetermined voltage is applied thereto, and continues to emit light, even if the input of the trigger light is stopped. A conventional driving apparatus of this pnpn device will be explained later in detail.

However, the conventional driving apparatus for a pnpn device has the following disadvantages:

1. The operation speed thereof is limited to the switching speed of the device, since the light output is obtained by the switching operation of the device.
2. The light power of the input trigger light is relatively high, since it is also used for the switching operation.
3. Since the light output is controlled by the strength of the applied voltage and/or the input trigger light, the control operation of the light output is difficult.

SUMMARY OF THE INVENTION

Accordingly, it is an object of the present invention to provide driving method and apparatus for a pnpn semiconductor device in which high speed operation is realized.

It is a further object of the present invention to provide driving method and apparatus for a pnpn semiconductor device having a low power consumption.

It is a still further object of the present invention to provide driving method and apparatus having a simple structure and a high signal transmission capacity.

According to one feature of the present invention, a driving method for a pnpn semiconductor device comprising an anode layer which consists of a p-type semiconductor, a cathode layer which consists of an n-type semiconductor, and a gate layer located between the anode layer and the cathode layer, the gate layer comprising a plurality of semiconductor layers and being narrower in forbidden bandgap than the anode layer and the cathode layer, and the pnpn semiconductor device emitting a stimulated emission light when the pnpn semiconductor device is set in a low impedance state, the driving method comprising:

applying a voltage higher than a holding voltage of the pnpn semiconductor device to an anode electrode thereof to apply an electric field across the anode and cathode layers;

supplying a control signal light to the pnpn semiconductor device to set the pnpn semiconductor device into a predetermined operation state; and supplying an information signal light to the pnpn semiconductor device;

the control signal light and the information signal light being time-sequentially supplied to the pnpn semiconductor device under the application of the voltage thereto, whereby the pnpn semiconductor device operates responsive to the information signal light.

According to another feature of the present invention, a driving apparatus for a pnpn semiconductor device comprises:

a light information transmission input line to be branched into a plurality of lines;

a light detection circuit coupled to at least one of the plurality of lines;

a pnpn semiconductor device coupled to one of the plurality of lines except for a line to which the light detection circuit is coupled;

a synchronous driving circuit which is coupled to the light detection circuit; and a light information transmission output line coupled to the pnpn semiconductor device;

wherein the synchronous driving circuit applies a voltage to the pnpn semiconductor device to be driven by receiving a light supplied from the light information transmission input line, when the light detection circuit detects an address of the pnpn semiconductor device included in a light supplied from the light information transmission input line.

BRIEF DESCRIPTION OF THE DRAWINGS

The present invention will be explained in more detail in accordance with the following drawings, wherein.

DESCRIPTION OF THE PREFERRED EMBODIMENTS

Figure 1:
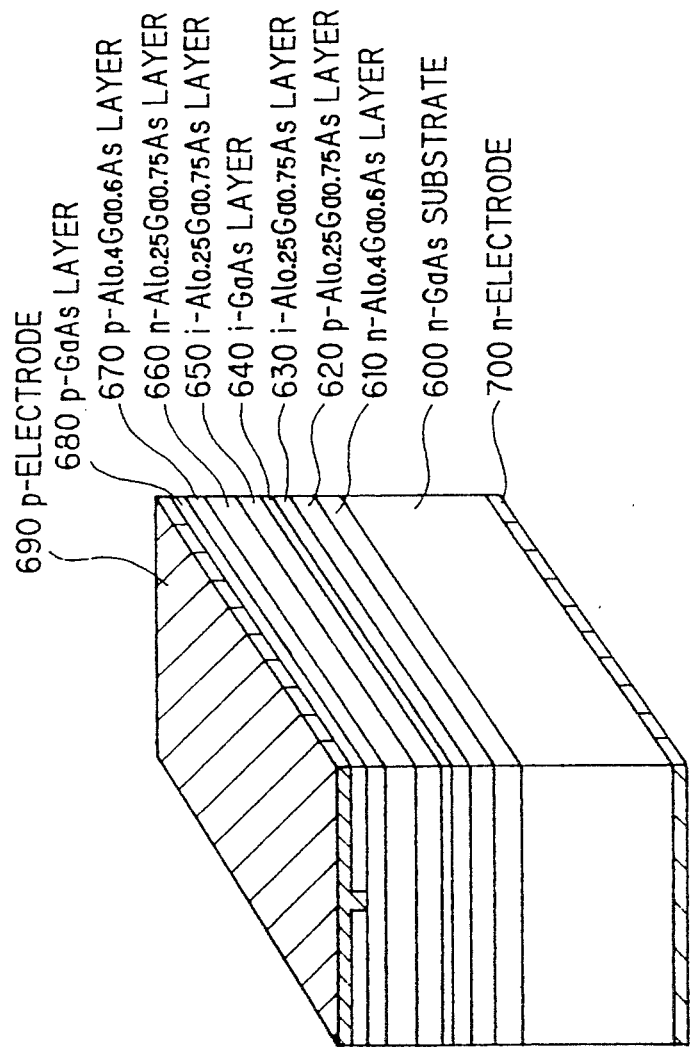
FIG. 1 is a perspective view showing a pnpn semiconductor device to be used in a conventional method and preferred embodiments according to the present invention.

A detail description will now be given of driving method and apparatus for the VSTEP with reference to FIGS. 1 to 5 before explaining driving method and apparatus for a pnpn semiconductor device according to the invention. FIG. 1 shows a device structure of the VSTEP. The epilayers are grown on an n-GaAs substrate 600 by molecular beam epitaxy, and are comprised of an n-$Al_{0.4}Ga_{0.6}As$ layer 610, a p-$Al_{0.25}Ga_{0.75}As$ layer 620, an i-$Al_{0.25}Ga_{0.75}As$ layer 630, an undoped GaAs active layer 640, an i-$Al_{0.25}Ga_{0.75}As$ layer 650, an n-$Al_{0.25}Ga_{0.75}As$ layer 660, a p-$Al_{0.4}Ga_{0.6}As$ layer 670, and a p-GaAs cap layer 680, wherein a p-gate layer consisting of the p-$Al_{0.25}Ga_{0.75}As$ layer 620, the i-$Al_{0.25}Ga_{0.75}As$ layers 630 and 650, and the GaAs layer 640, and an n-gate layer consisting of the n-$Al_{0.25}Ga_{0.75}As$ layer 660 are sandwiched by a cathode layer of the n-$Al_{0.4}Ga_{0.6}As$ layer 610 and an anode layer of the p-$Al_{0.4}Ga_{0.6}As$ layer 680. The device further comprises p-and n-electrodes 690 and 700, respectively, provided on the cap layer 680 and the substrate 600.

Figure 2:
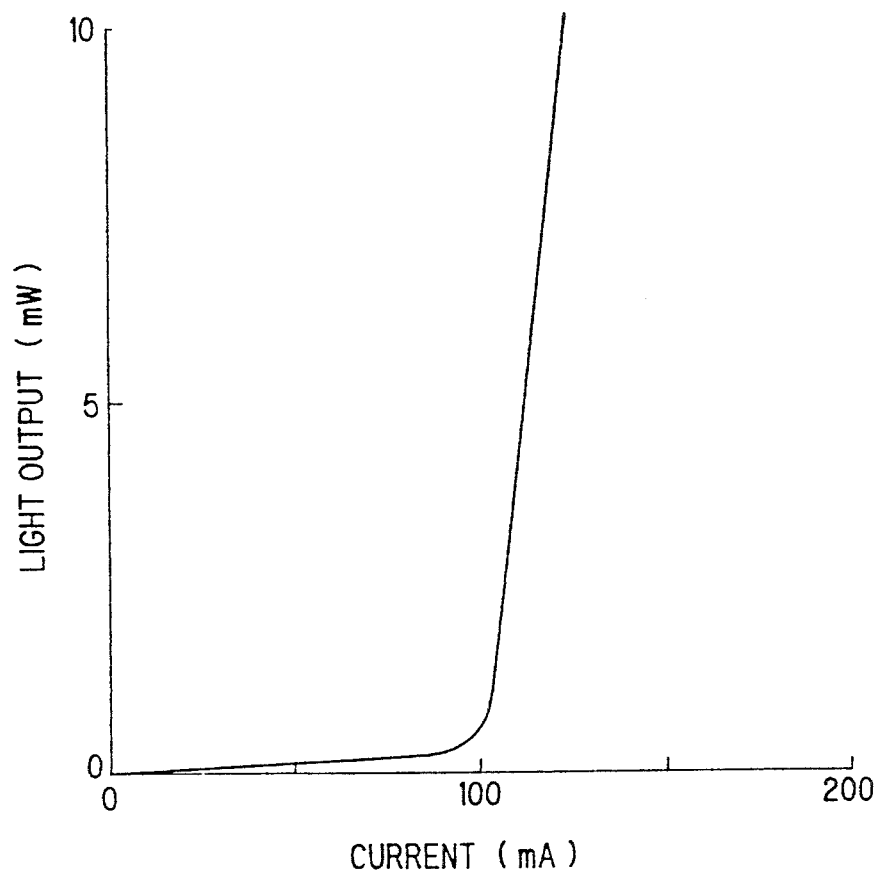
FIG. 2 is a graph showing a light output relative to a current flowing through the pnpn semiconductor device in FIG. 1.
Figure 3:
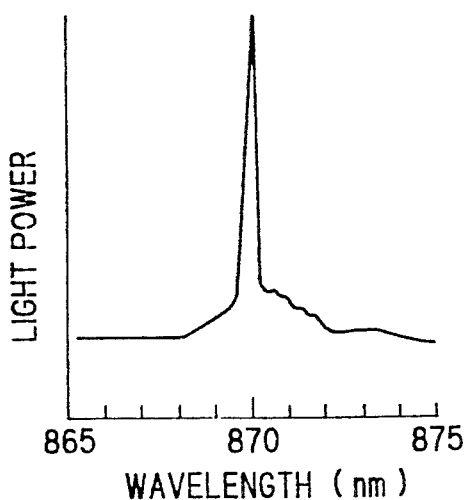
FIG. 3 is an explanatory diagram showing a wavelength of a light emitted from the pnpn semiconductor device in FIG. 1.

In operation, when the VSTEP 800 is switched from a high impedance state to a low impedance state, carriers are confined in the gate regions, and thus the device emits light. In this ON state, the VSTEP emits a 870 nm wavelength-stimulated emission light by setting a current flowing through the device to be more than a threshold value (100 mA), as shown in FIGS. 2 and 3.

Figure 4:
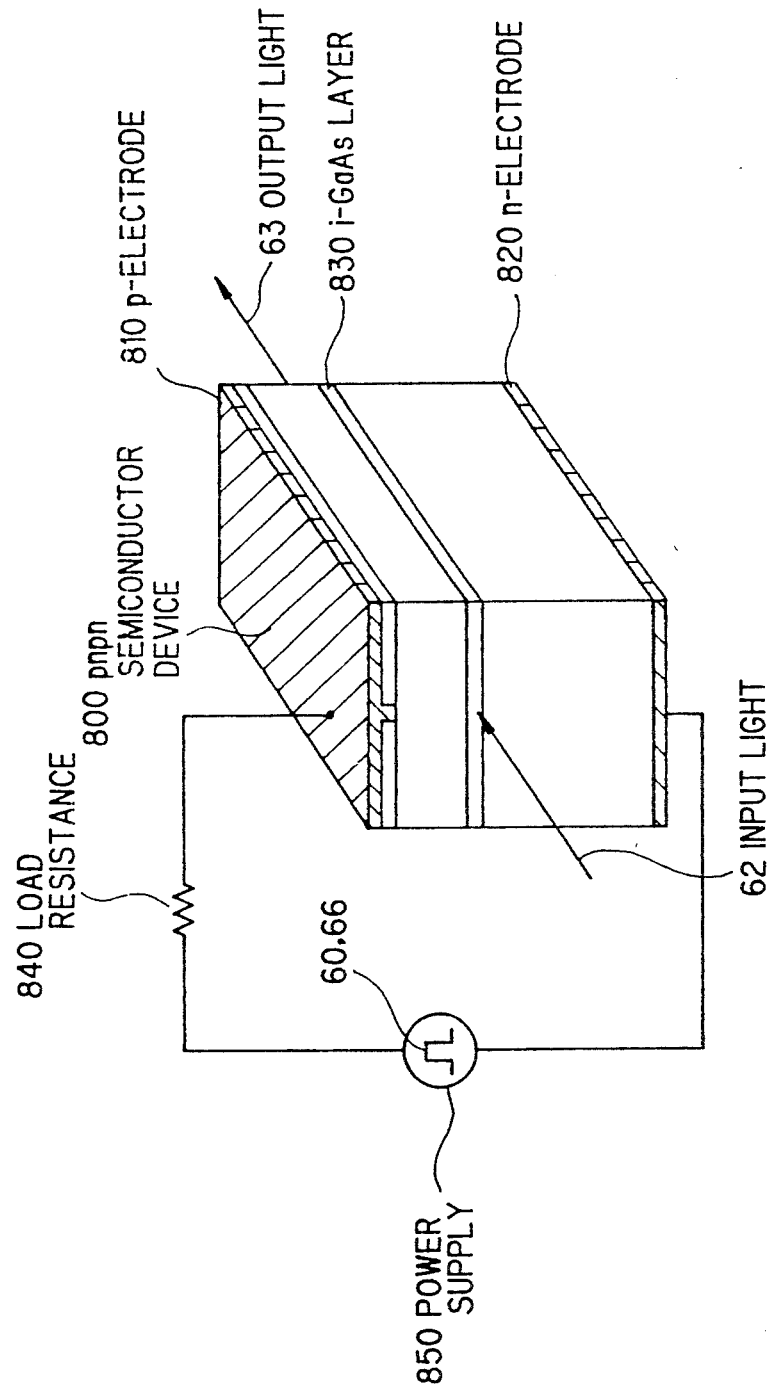
FIG. 4 is an explanatory diagram showing a driving circuit for the pnpn semiconductor device in FIG. 1, FIGS. 5A to 5C are timing charts showing operation of a conventional driving method of a pnpn semiconductor device.

FIG. 4 shows a circuitry construction of a driving apparatus of the VSTEP. In this apparatus, the VSTEP 800 comprising p- and n-electrodes 810 and 820 and i-GaAs active layer 830 (other layers are not shown) is connected to a series connection of a load resistance 840 and a power supply 850.

Figure 5A:
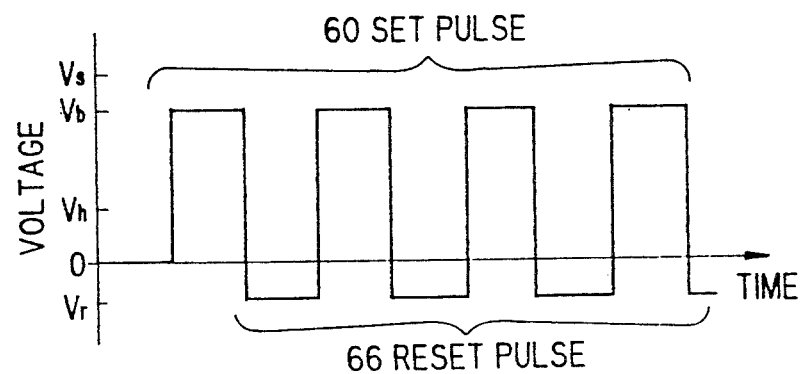
Figure 5B:
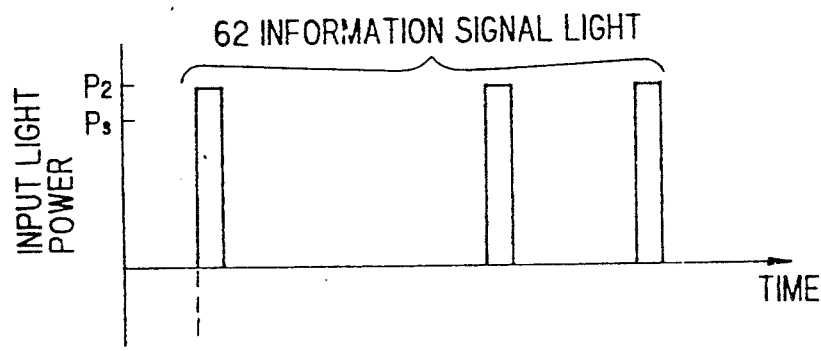
Figure 5C:
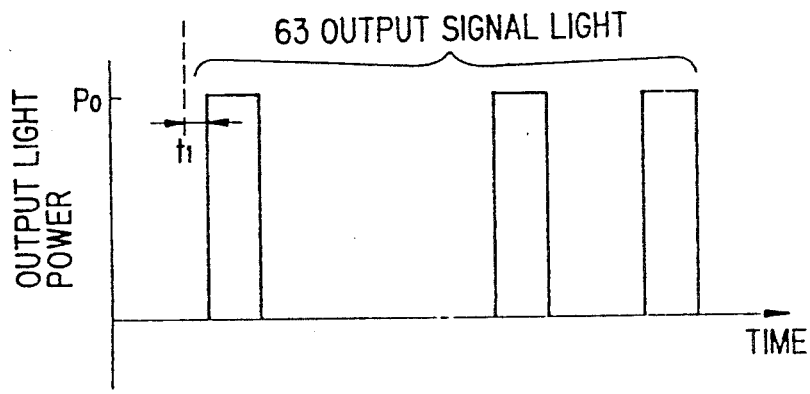

In operation, as shown in FIG. 5A, set pulses 60 having a positive voltage Vb which is higher than a holding voltage Vh and lower than a switching voltage Vs, and reset pulses 66 having a negative voltage Vs are alternately applied to the p-electrode 810 from the power supply 850. Under the application of the set pulse 60, the VSTEP 800 cannot be switched into the ON state because of Vb<Vs. In this state, an information signal light 62 is supplied to the VSTEP 800 in synchronization with the set pulse 60, as shown in FIG. 5B. When the supplied light 62 has an energy higher than a predetermined light power Ps, the VSTEP 800 is switched into the ON state, and emits the output signal light 63, as shown in FIG. 5C with a time delay $t_1$. In this case, the current flowing through the VSTEP 800 is set at the ON state to be more than the threshold current by setting the load resistor 840 to be an appropriate value. Hereupon, the values "Vs=5 V, Vh=−1.5 V, (threshold current)=100 mA, Ps=10 pJ, Vr=−0.5 V, and (load resistance 840)=27Ω" are selected. In this condition, the current of approximately 110 mA flows through the VSTEP 800 at the ON state, and the output light is approximately 3 mW. Since the energy Ps of the input signal light 62 is set 10 pJ (=10 ns×1 mW), the information signal light is amplified by about 3 times. Since the VSTEP 800 emits the light 63, while the set pulse 60 is applied thereto, the VSTEP 800 can function as an optical memory and a switch, and additionally it functions as a logic operator such as an AND circuit, etc., if a plurality of input lights are supplied thereto. As described above, the input light is amplified as the output lights, so that no amplifier is necessary in case of transmitting a signal light to a next stage.

A description will now be given of driving method and apparatus for a pnpn semiconductor device of a first preferred embodiment according to the present invention with reference to FIG. 6. In this preferred embodiment, the pnpn semiconductor device shown in FIG. 1 and the driving circuit shown in FIG. 3 are used, and the load resistance 840 shown in FIG. 3 is set to be 33 Ω.

Figure 6A:
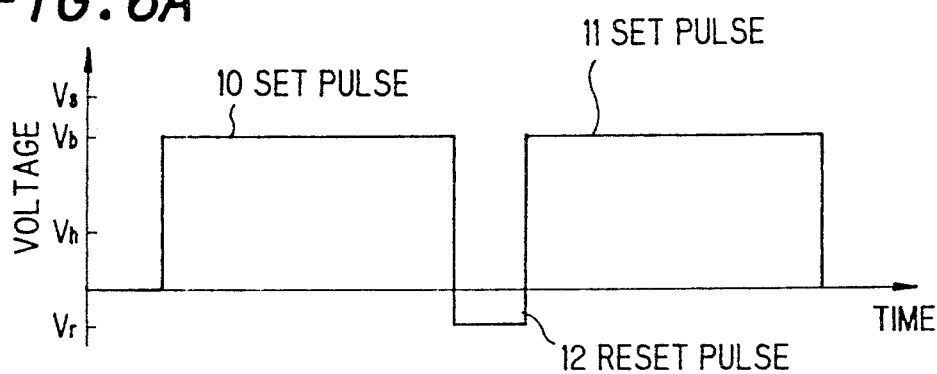
FIGS. 6A to 6D are timing charts showing operation of a driving method of a pnpn semiconductor device in a first preferred embodiment according to the present invention.
Figure 6B:
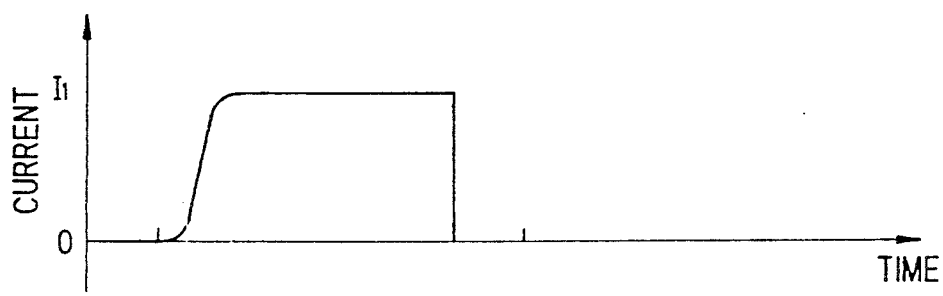
Figure 6C:
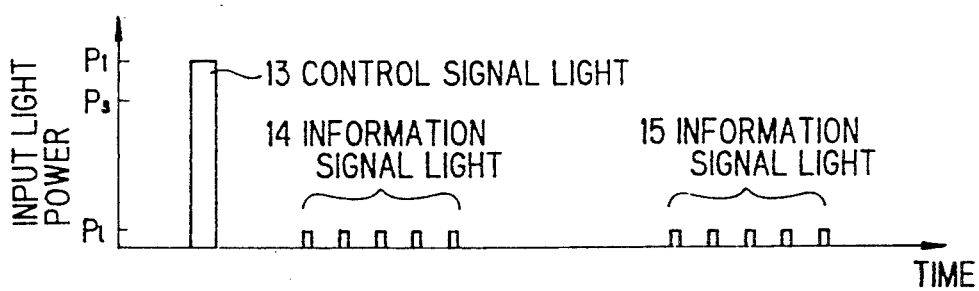
Figure 6D:
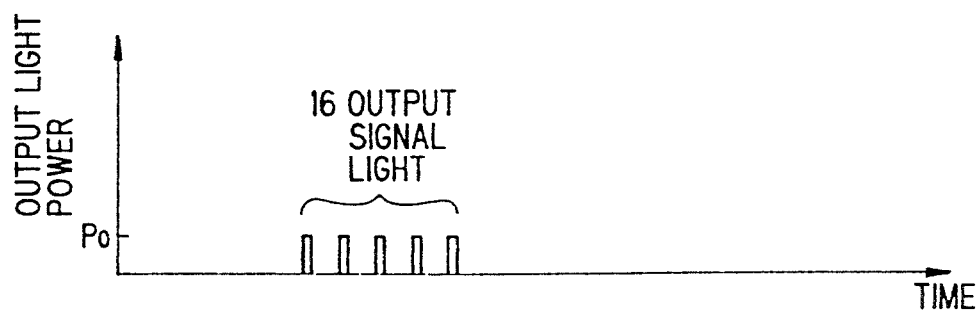

In operation, set pulses 10 and 11 having a voltage Vb (=4.5 V) which is higher than a holding voltage Vh (=1.5 V) and lower than a switching voltage Vs (=5 V), and a reset pulse 12 having a voltage Vr (=−0.5 V) are applied to the pnpn semiconductor device from the power supply, as shown in FIG. 6A. Since the device is not switched into the ON state only by the set pulse 10, as mentioned in relation to the conventional driving method, a control signal light 13 having a wavelength 870.0 nm and a light power $P_1$ more than a predetermined light power Ps is supplied thereto in synchronization with the set pulse 10, as shown in FIG. 6C. As a result, the device is switched into the ON state (low impedance state), and the current shown in FIG. 6B accordingly flows therethrough. During the application of the set pulse 10 to the device, the current value $I_1$ is 90 mA. Since the current value (90 mA) is less than the oscillating threshold current value 100 mA, the device does not oscillate, and thus the emitted light is very small. In this state, information signal lights 14 are supplied to the device. The device does not oscillate yet, but radiates output signal lights 16 having a wavelength of 870.0 nm which is a resonant wavelength, as shown in FIG. 6D. This operation of this device is the same as that in a laser amplifier. The light power Pi of the information signal lights 14 is 0.1 mW and is much less than the predetermined light power Ps, and that Po of the output signal lights 16 is about 0.5 mW, thus the optical strength of the information signal lights 16 is amplified by about five times. Subsequently, as shown in FIG. 6A, the reset pulse 12 is applied to the device to be turned into the OFF state. Then, even if a next set pulse 11 is supplied to the device as shown in FIG. 6A, the device remains in the OFF state as shown in FIG. 6B, since the control signal light is not supplied thereto as shown in FIG. 6C. In this state, even if the information signal lights 15 are supplied to the device, the device does not radiates the output signal light, as shown in FIGS. 6C and 6D.

In this first preferred embodiment, the information signal lights are supplied to the device which is switched into the ON state by the set pulse 10 and the control signal light 13, as explained above. In the conventional driving method, however, since the response speed of the driving circuit depends on the switching operation of the device having the aforementioned delay time $t_1$, the operation speed of the driving circuit is limited. In this first preferred embodiment, on the other hand, the output signal light can be obtained at a speed higher than the switching speed of the device, since the information signal light is supplied to the device which is already switched into the ON state. In addition, since it is not necessary to switch the device on every time when the input light is supplied thereto, the light power $P_1$ of the information signal light 14 is lower than Ps. Moreover, the emission of the output light can be easily controlled only by the supply of the control signal light 13.

Figure 7:
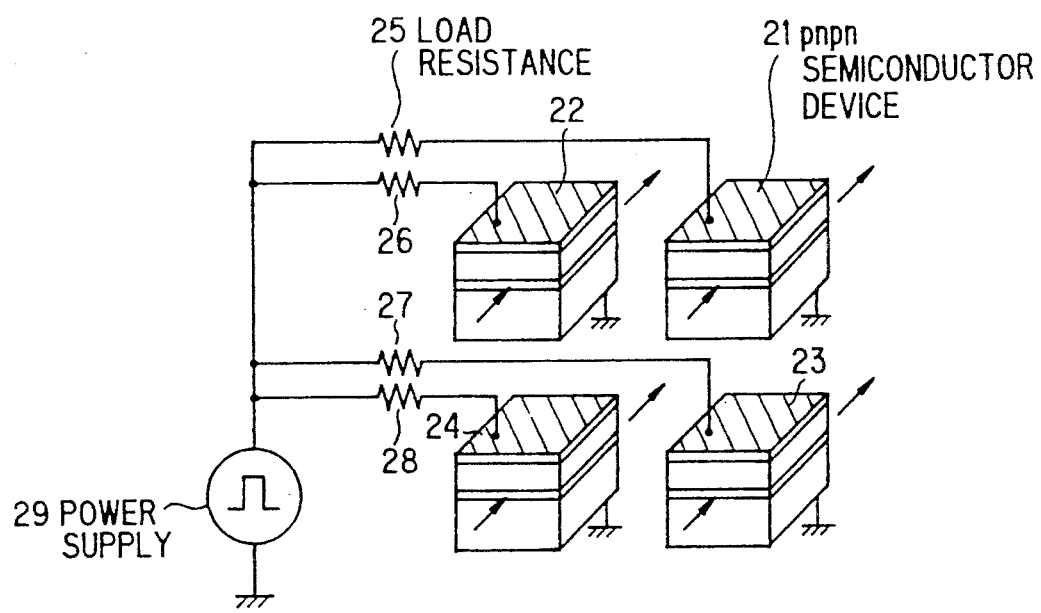
FIG. 7 is an explanatory diagram showing a driving circuit used in the first preferred embodiment.

These described advantages are useful for a case where the devices are matrically arranged in parallel to a power supply 29, as shown in FIG. 7, wherein a voltage is commonly applied through resistances 25, 26, 27 and 28 to pnpn devices 21, 22, 23 and 24 from the power supply 29, so that the ON/OFF states of each device is controlled by the control signal light. On the contrary, according to the conventional driving method, a plurality of driving circuits corresponding to the number of the devices are necessary, and a synchronous circuit which synchronizes operation of a corresponding driving circuit is also necessary. In this matrix arrangement, the voltage of the set pulse is maintained constant, while the output signal light is adjusted by the control signal light and the information signal light. Instead, the control signal light and the information signal light may be maintained constant, while the output signal light may be adjusted by the voltage of the set pulse.

Figure 8:
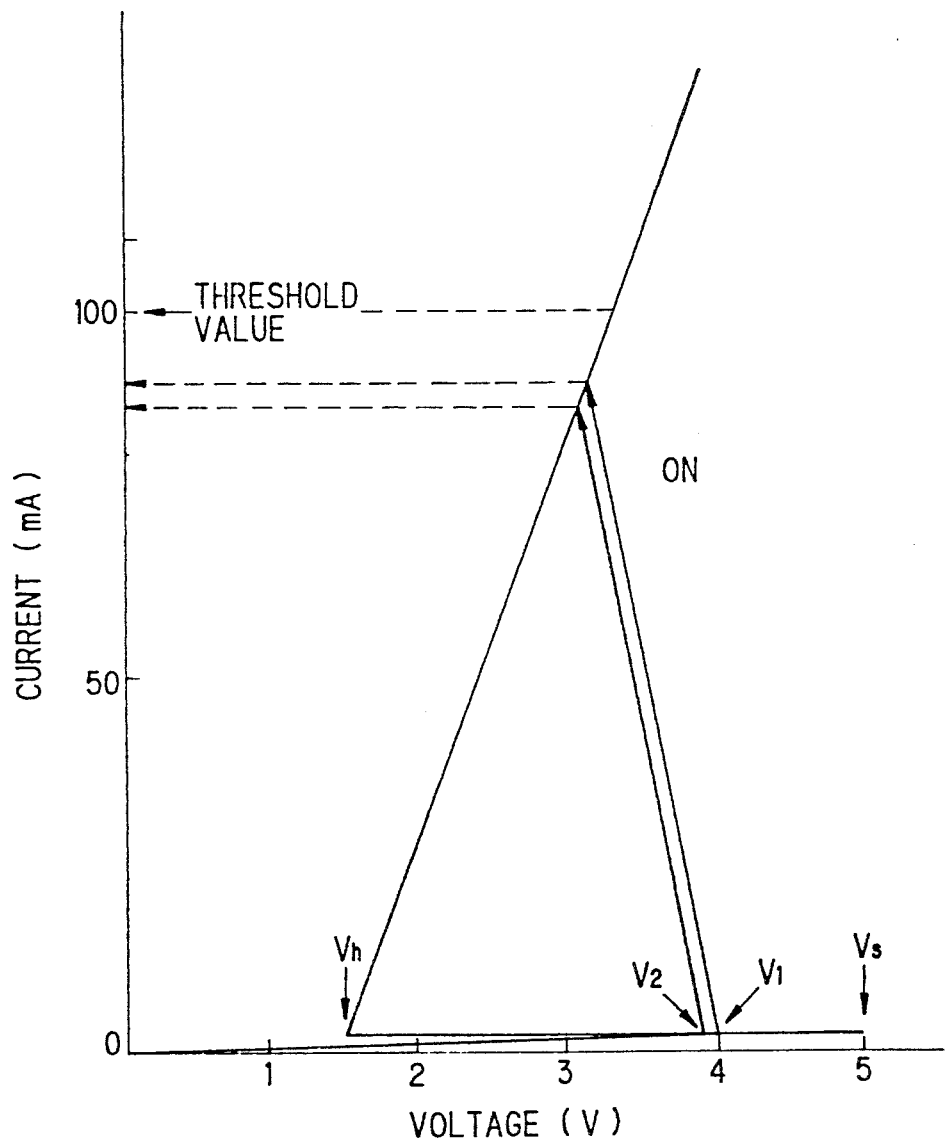
FIG. 8 is a graph showing a current flowing through the pnpn semiconductor device in FIG. 1 relative to a voltage applied thereto.

A current to voltage characteristic of the above described pnpn semiconductor device will be explained in FIG. 8, wherein Vs is a switching voltage, Vh is a holding voltage, and $V_1$ and $V_2$ are voltages applied to the device. This shows that a current is changed to flow through the device which is turned on by an applied voltage. When the applied voltage is set to provide a current of less than the threshold value, the pnpn semiconductor device operates as an optical amplifier. When the optical amplifier provides light reflection on both sides thereof, it operates as a resonant type optical amplifier for amplifying light selectively at a resonant wavelength which is determined by an equivalent refractive index and a resonator length. In this resonant type optical amplifier, a resonant wavelength is controlled by a current (voltage), since an equivalent refractive index is changed in accordance with plasma effect by the current (voltage).

Figure 9:
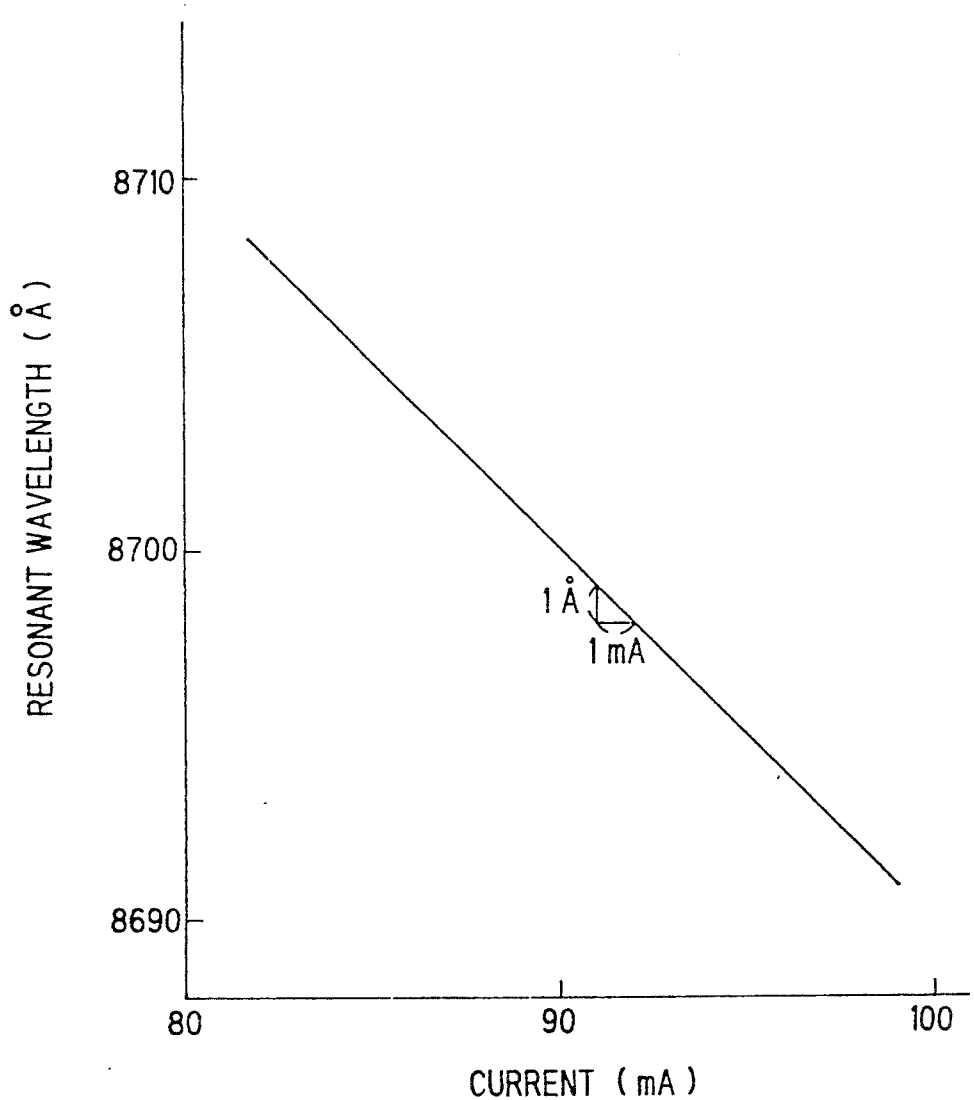
FIG. 9 is a graph showing a resonant wavelength relative to a current flowing through the pnpn semiconductor device in FIG. 1, FIGS. 10A to 10D are timing charts showing operation of a driving method of a pnpn semiconductor device in a second preferred embodiment according to the present invention.

The change of a resonant wavelength which is caused by a current flowing through the pnpn semiconductor device will be explained in FIG. 9. As shown therein, the resonant wavelength is changed in the direction of short wavelength dependent on the increase of the current by approximately 1 Å/mA. Therefore, an output information signal light having a predetermined wavelength is selected from wavelength multiplexed input information signal lights supplied to the device without any limitation of a switching speed of the device by a predetermined voltage applied to the device.

Figure 10A:
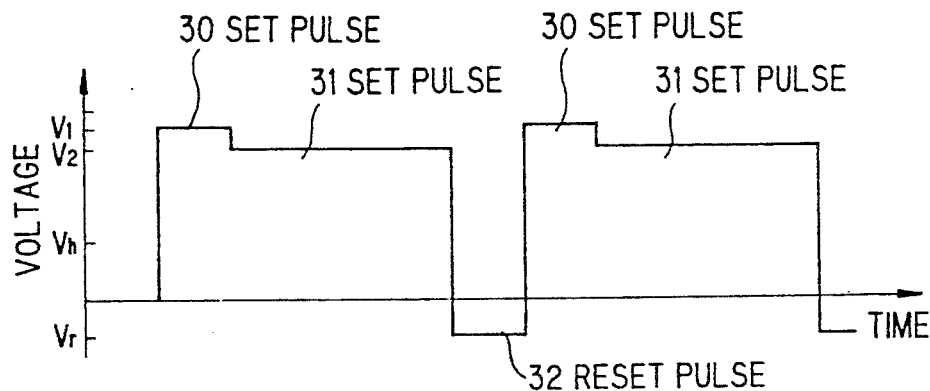
Figure 10B:
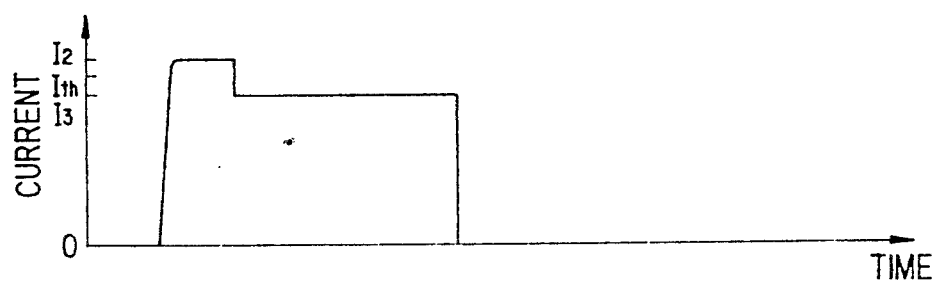
Figure 10C:
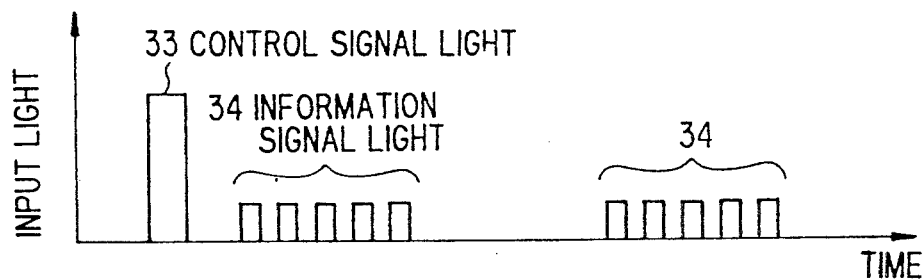
Figure 10D:
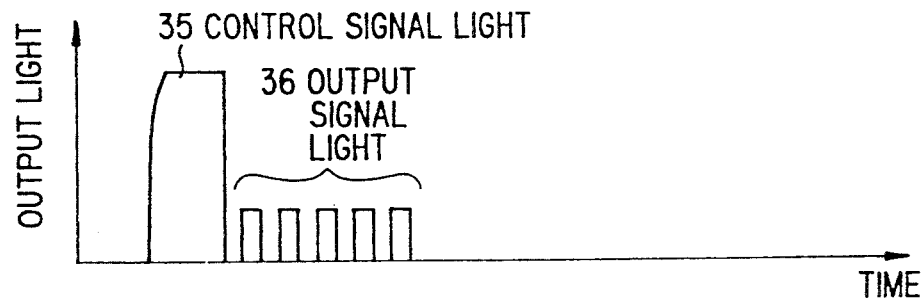

A description will now be given of a driving method of a pnpn semiconductor device of the second preferred embodiment according to the present invention with reference to FIGS. 10A to 10D. The device and the driving circuit used in the first preferred embodiment are also used in this preferred embodiment. The first set pulse 30 ($V_1$=5.2 V), the second set pulse 31 ($V_2$=4.5 V), and the reset pulse 32 (Vr=−0.5 V) are applied to the device from the power supply 850 as shown in FIG. 10A. In order to switch the device into the ON state, the control signal light 33 having a wavelength 870.0 nm and the light power more than Ps is supplied to the device, as shown in FIG. 10C, in synchronization with the set pulse 30. Consequently, the device is switched into the ON state (low impedance state), as shown in FIG. 10B. When the first set pulse 30 is applied to the device, the device oscillates, since the current $I_2$ flowing therethrough is 110 mA which is higher than the oscillation threshold current value (Ith=100 mA). Thus, about 3 mW output signal light 35 is radiated therefrom. When the subsequent set pulse 31 is applied to the device, it does not oscillate, since the current $I_3$ flowing therethrough is 90 mA which is lower than the oscillation threshold current value ($I_{th}=100$ mA). When the subsequent information signal lights 34 are supplied to the device in the ON state, it does not oscillate yet, and radiates the output signal lights 36 having a wavelength of 870.0 nm, as shown in FIG. 10D, which is the resonant wavelength, as seen in a well-known laser amplifier. The light power of the information signal light 34 is 0.1 mW and that of the output signal light 36 is about 0.5 mW, thus the light intensity of the information signal light 16 is amplified by about five times. Subsequently, as shown in FIG. 10A, the reset pulse 32 switches the device into the OFF state. Even if a next set pulse 30 is applied to the device, the device remains in the OFF state, since the control signal light is not supplied thereto as shown in FIGS. 10A and 10B. In this state, even if the information signal light 34 is supplied to the device, the device does not radiate the output signal light, as shown in FIGS. 10C and 10D.

Thus, the driving method of this second preferred embodiment can overcome the above disadvantages of the conventional one. In addition, in the first preferred embodiment, since the control signal light is absorbed and vanished to provide no output control light signal, it is necessary to apply a control signal light to a pnpn semiconductor device which is positioned at a following stage, where a plurality of pnpn semiconductor devices are arranged in tandem. Therefore, the driving circuits and the controlling of their operation becomes complicated, since a plurality of light sources for control signal lights, driving circuits for the plural devices, and synchronous circuits for control and information signal lights must be used. These disadvantages are overcome in the second preferred embodiment. That is, since the set pulse comprises the first and second set pulses, the device oscillates to provide an output control signal light which will be a control signal light supplied to a device provided at a following stage, when the control signal light is supplied thereto, and does not oscillate and functions as an optical amplifier, when the information signal light is supplied thereto. This second preferred embodiment is advantageously applicable to the driving circuit shown in FIG. 7.

Figure 11:
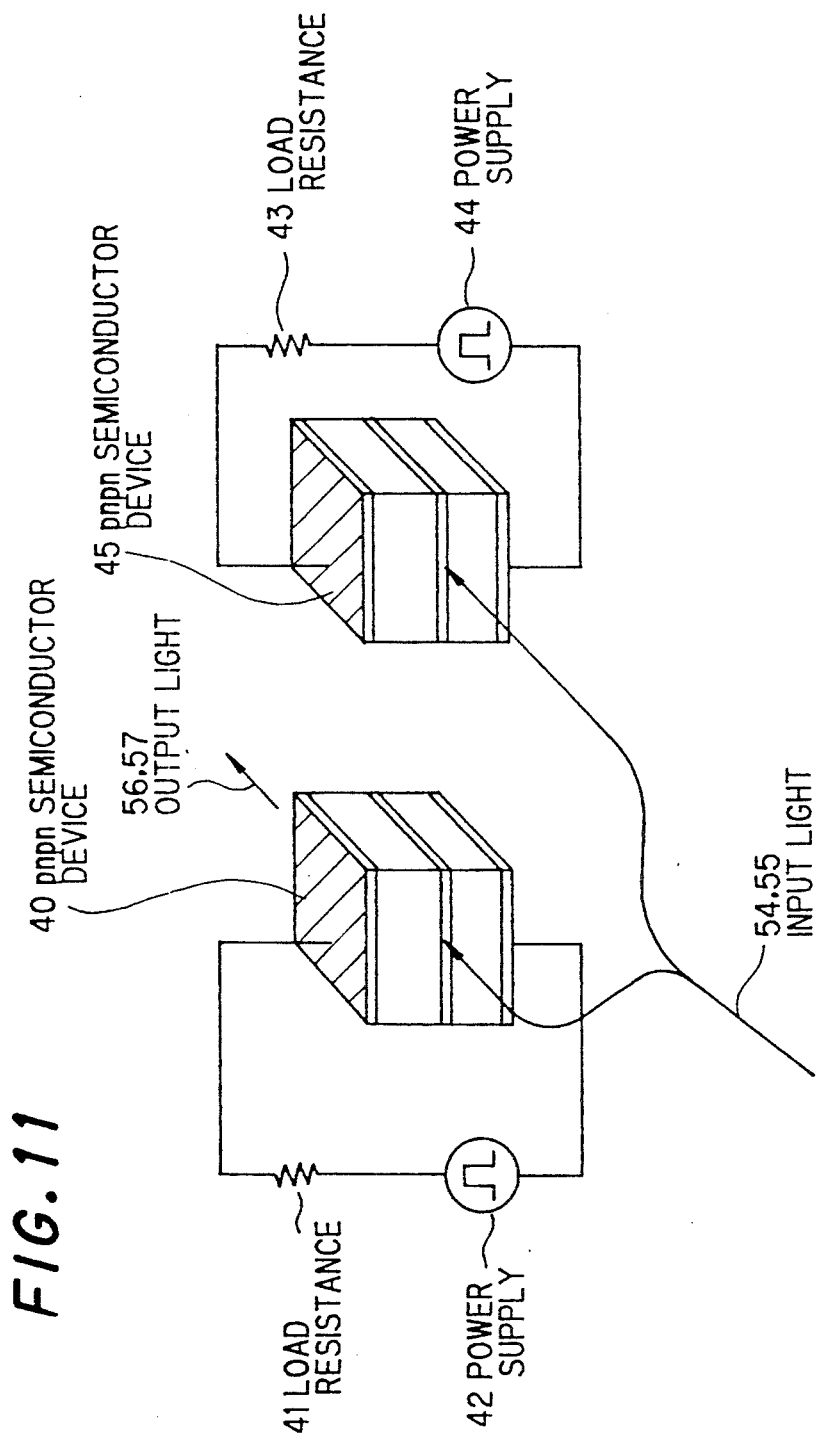
FIG. 11 is an explanatory diagram showing a driving circuit for a driving method of a pnpn semiconductor device in a third preferred embodiment according to the present invention.
Figure 12A:
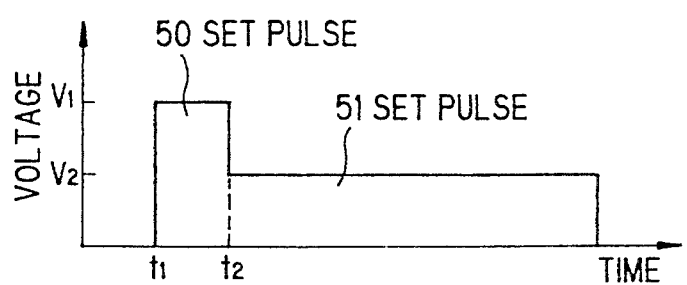
FIGS. 12A to 12E are timing charts showing operation in the third preferred embodiment.
Figure 12B:
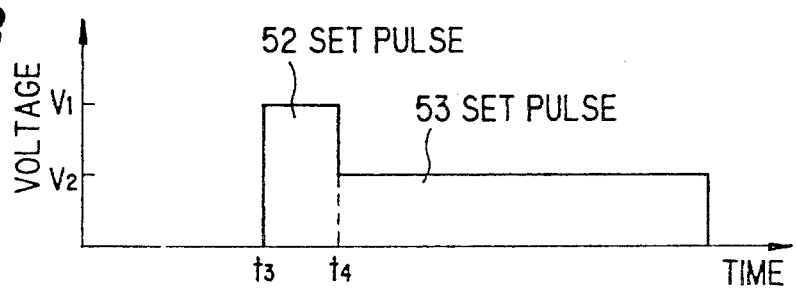
Figure 12C:
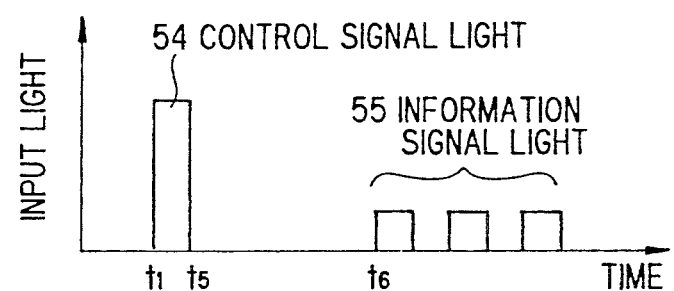
Figure 12D:
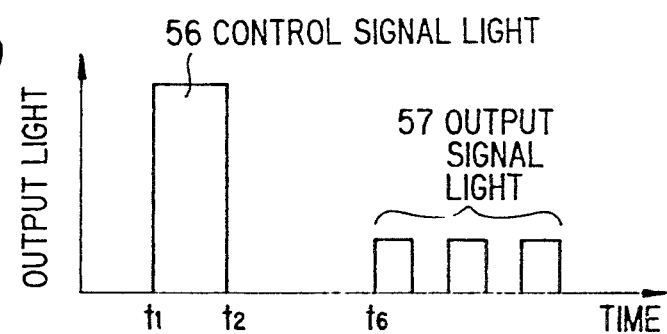
Figure 12E:

A description will now be given of a driving method of the third preferred embodiment according to the present invention with reference to FIGS. 11 and 12, wherein two pnpn semiconductor devices 40 and 45 are connected to driving circuits having power supplies 42 and 44, and resistances 41 and 43, respectively. The set pulses 50 and 51 shown in FIG. 12A are applied to the device 40 by the power supply 42, and the set pulses 52 and 53 shown in FIG. 12B are applied to the device 45 by the power supply 44. The set pulses 50 and 52 have the same voltage $V_1$ and the same pulse duration $t_1$ to $t_2$, and the set pulses 51 and 53 have the same voltage $V_2$ and the same pulse duration $t_3$ to $t_4$. The set pulses 51 and 53 are respectively applied to the devices 40 and 45, subsequent to the set pulses 50 and 52, as shown in FIGS. 12A and 12B. The characteristics and structure of the devices 40 and 45, and the driving circuits, etc. are the same as those explained hereinbefore. The control signal light 54 shown in FIG. 12C is simultaneously supplied to both of the devices 40 and 45 during $t_1$ to $t_5$. The light power of the control signal light 54 is the same as that of the former preferred embodiments. Thus, the device 40 is switched into the ON state and emits the light 56. Then, the device 40 is set in a laser amplifier mode in response to the subsequent set pulse 51 applied thereto, and emits the output signal light 57 in response to the information signal light 55, as shown in FIGS. 12C and 12D. In addition, the set pulse 52 is applied to the device 45 during $t_3$ to $t_4$, and subsequently, the set pulse 53 is applied thereto, as shown in FIG. 12B. Since the control signal light 54 is not synchronized with the set pulse 52, the device 45 remains in the OFF state and emits no output signal light, as shown in FIG. 12E.

Thus, the driving method of this embodiment can overcome the above disadvantages of the conventional one. That is, a control signal light is selectively supplied to a device selected from a plurality of devices in the conventional driving method, so that an information signal light is transmitted through the selected device, while information signal lights are stopped by non-selected devices. Thus, the plurality of devices operate as an optical switch. As a result, disadvantages such as the necessity of a complicated circuit for controlling a plurality of light sources of control signal lights, the timing adjustment of the control signal lights, etc. occurs in the conventional driving method. In this third preferred embodiment, however, an optical switch, in which a device is turned on only by a time-position of a control signal light, and a direction of an output light is determined by an input light of the device, is easily realized, when control signal lights, and set pulses are time-sequentially addressed, respectively, so that a device having a timing, at which the set pulse and the control signal light are received, is turned on to transmit an information signal light. In this third preferred embodiment, although a pnpn semiconductor device having a laser oscillation property is utilized, it may be replaced by a stimulated light emission device such as a device having AR coatings on the both sides thereof, and the reason that first and second set pulses having different voltages is applied to the device is to control the device to be turned on by the control signal light, and not to be turned on by the information signal light. Therefore, the first and second set pulses may have an equal voltage, or the second set pulse may be larger in voltage than the first set pulse, when the control signal light is larger than the information signal light, provided that a current caused by the second set pulse is required to be less than a threshold current of a self-oscillation.

Figure 13A:
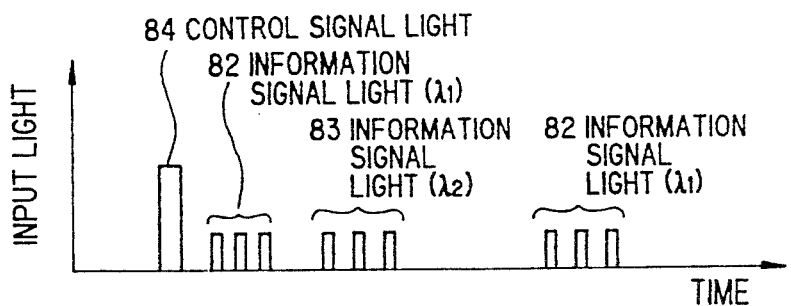
FIGS. 13A to 13F, and 14A to 14F are timing charts showing operation of a driving method of a pnpn semiconductor device in fourth and fifth preferred embodiments according to the present invention.
Figure 13B:
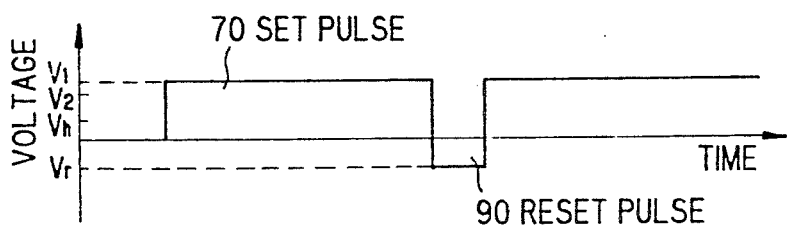
Figure 13C:
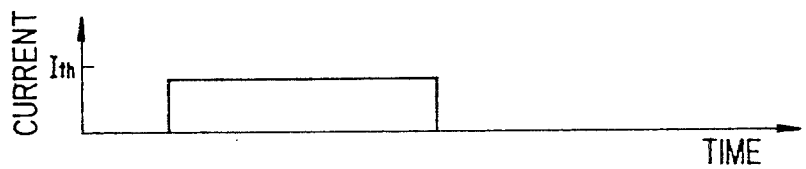
Figure 13D:
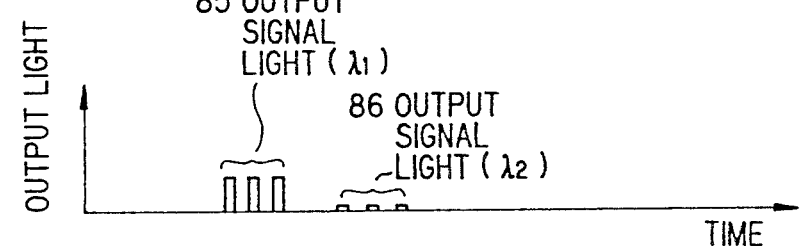
Figure 13E:
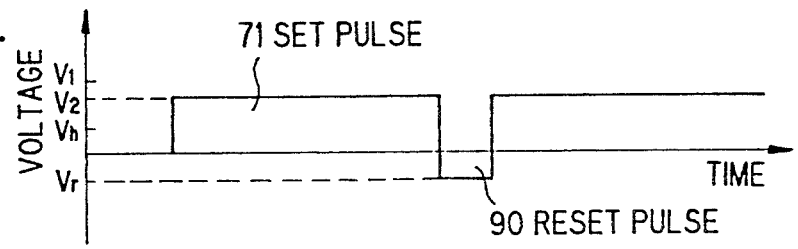
Figure 13F:
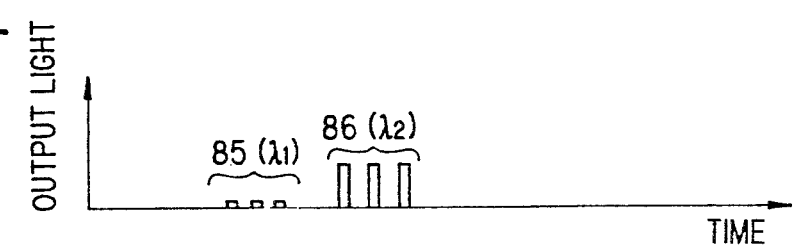

A description will now be given of a driving method of the fourth preferred embodiment according to the present invention with reference to FIGS. 13A to 13F, wherein the same device and driving circuit as those explained hereinbefore are also used. The set pulse 70 ($V_1 = 4.5$ V) and the reset pulse 90 ($V_r = -0.5$ V) are applied to the device by the power supply as shown in FIG. 13B. In order to switch the device into the ON state, the control signal light 84 having a wavelength of 870.0 nm and a light power more than Ps is supplied thereto in synchronization with the set pulse 70, as shown in FIG. 13A. Accordingly, the current of 90 mA flows through the device, as shown in in FIG. 13C. In this forth preferred embodiment, the device does not oscillate and the light power of the output signal light is very small, since the voltage $V_1$ is too small for the oscillation. When the information signal light 82 having a wavelength ($\lambda_1 = 870.0$ nm) and the information signal light 83 having a wavelength ($\lambda_2 = 870.2$ nm) and a light power more than Ps is supplied to the device, as seen in the well-known laser amplifier, as shown in FIG. 13A, the output signal light 85 having the wavelength ($\lambda_1 = 870.0$ nm) which is the resonant wavelength is emitted. On the other hand, the light power of the output signal light 86 having the wavelength ($\lambda_2 = 870.2$ nm) becomes lower than the output signal light 85 by 20 dB, and thus the information signal light 82 is selectively amplified, as shown in FIG. 13D. Instead, if the set pulse 71 ($V_2 = 4.4$ V) and the reset pulse 90 ($Vr = -0.5$ V) are continuously applied to the device, as shown in FIG. 13E, the current flowing therethrough is 88 mA to be lower than the oscillation threshold current value (Ith = 100 mA) during the application of the set pulse 71. If the information signal light 82 having a wavelength ($\lambda_1 = 870.0$ nm) and the information signal light 83 having a wavelength ($\lambda_2 = 870.2$ nm) is supplied to the device, the output signal light 86 having the wavelength ($\lambda_2 = 870.2$ nm) which is the resonant wavelength is emitted, and a small light power of the output signal light 85 which is lower than that of the output signal light 86 by 18 dB is emitted, and thus the information signal light 83 is selectively amplified, as shown in FIG. 13F. Thus, we have confirmed a wave selection characteristic. The light power of the input light is 0.1 mW and that of the output light is the 0.5 mW, and thus the input light is amplified by five times. After the device is turned back to the OFF state by the reset pulse 90, the set pulses 70 and 71 are applied thereto as shown in FIGS. 13B and 13E, respectively. Since the control signal is not supplied thereto as shown in FIG. 13A, the device remains in the OFF state, as shown in FIG. 13C. Subsequently, when the information signal light 82 is supplied to the device in the OFF state, as shown in FIG. 13A, it operates as a light receiving device, so that it absorbs the supplied light and does not emit the output light as shown in FIGS. 13D and 13F. Since the light power of the information signal light is lower than that of the control signal light, the device is not switched into the ON state by the information signal light.

Figure 14A:
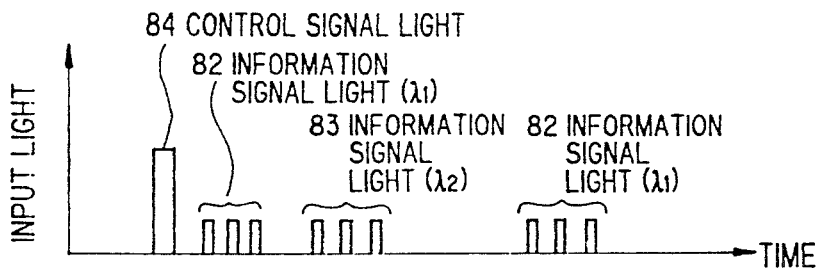
Figure 14B:
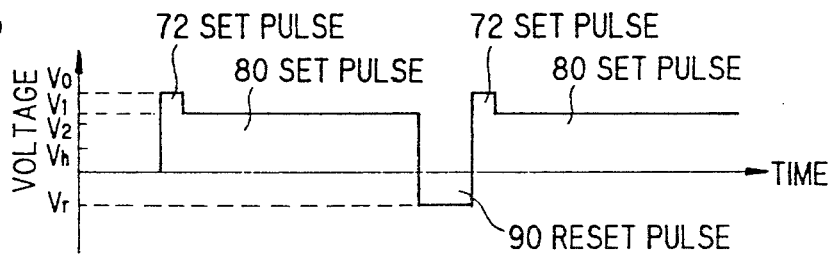
Figure 14C:
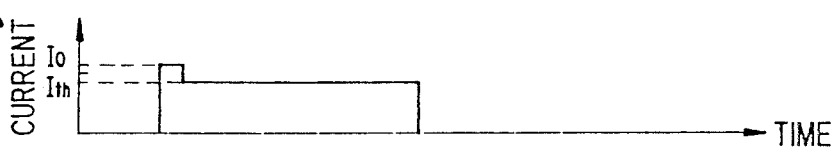
Figure 14D:
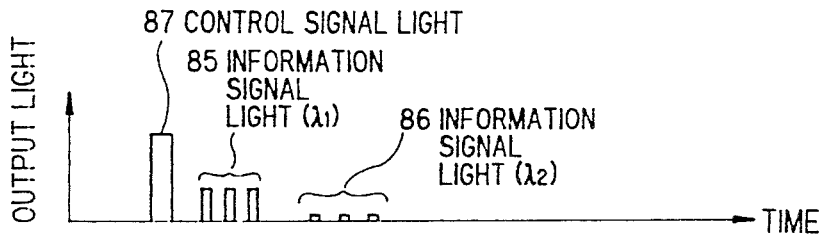
Figure 14E:
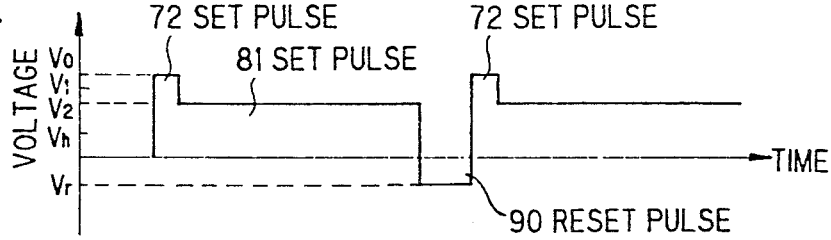
Figure 14F:
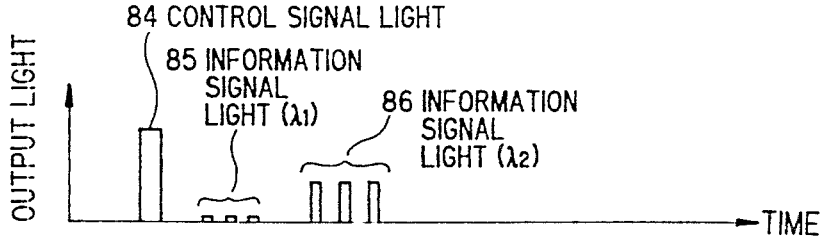

A description will now be given of a driving method of the fifth preferred embodiment according to the present invention with reference to FIGS. 14A to 14F. The device and driving circuit which are the same as those explained hereinbefore are also used in this fifth preferred embodiment. The set pulses 72 ($V_0 = 5.2$ V) and 80 ($V_1 = 4.5$ V), and the reset pulse 90 ($Vr = -0.5$ V) are continuously applied to the device by the power supply as shown in FIG. 14B. In order to switch the device into the ON state, the control signal light 84 having a wavelength of 870.0 nm and a light power more than Ps is applied thereto in synchronization with the set pulse 72, as shown in FIG. 14A, and consequently the current flows therethrough as shown in FIG. 14C. Since the current is 110 mA to be more than the oscillation threshold current value (Ith = 100 mA) under the application of the set pulse 72, the device oscillates. In this case, the light power of the output light 87 is approximately 3 mW. When the subsequent reset pulse 90 is applied to the device, the current flowing therethrough is 90 mA to be less than the oscillation threshold current value, so that it does not oscillate. When the information signal light 82 having a wavelength ($\lambda_1 = 870.0$ nm) and the information signal light 83 having a wavelength ($\lambda_2 = 870.2$ nm) are supplied to the device in the ON state, it emits the output signal light 85 having a wavelength ($\lambda_1 = 870.0$ nm) which is the resonant wavelength, as seen in the well-known laser amplifier, and a small light power of the output signal light 86 having a wavelength ($\lambda_2 = 870.2$ nm) which is lower than that of the output signal light 85 by 20 dB. Thus, the information signal light 82 is selectively amplified. When the set pulse 72 ($V_0 = 5.2$ V), the set pulse 81 ($V_2 = 4.4$ V), and the reset pulse 90 ($Vr = -0.5$ V) are continuously applied to the device, the current of 110 mA flows therethrough under the application of the set pulse 72, and it oscillates to emit the output signal light 87 having a light power of approximately 3 mW. In addition, when the subsequent set pulse 81 is applied thereto, the current of 88 mA flows therethrough, so that it does not oscillate. When the information signal light 82 having a wavelength ($\lambda_1 = 870.0$ nm) and the information signal light 83 having a wavelength ($\lambda_2 = 870.2$ nm) are supplied to the device in the ON state, it does not oscillate. But it emits the output signal light 86 having a wavelength ($\lambda_2 = 870.2$ nm), as seen in the well-known laser amplifier, and the light power of the output signal light 85 having a wavelength ($\lambda_1 = 870.0$ nm) is lower than that of the output signal light 86 by 18 dB. Thus, the information signal light 83 is selectively amplified. Thus, we have confirmed a wavelength selection characteristic. The light power of the input light is 0.1 mW and that of the output light is 0.5 mW, and thus the input light is amplified by five times. After the device is turned back to the OFF state by the reset pulse 90 as shown in FIGS. 14B and 14E, the set pulse 72 is applied thereto again. Since the control signal light is not supplied thereto, as shown in FIG. 14A, the device remains in the OFF state, as shown in FIG. 14C. When the subsequent set pulse 81 lower than the switching voltage is applied thereto, it remains in the OFF state. Subsequently, when the information signal light 82 is supplied to the device in the OFF state, as shown in FIG. 14A, it operates as a light receiving device, so that it absorbs the input light to emit no output light as shown in FIG. 14D. Since the light power of the information signal light is lower than that of the control signal light, the device is not switched into the ON state by the information signal light.

In the above preferred embodiments, information signal lights having different wavelengths are shown at different timings. However, these single lights may be supplied to a pnpn device at the same timing.

A description will now be given of a driving method of the sixth preferred embodiment according to the present invention with reference to FIG. 15.

An apparatus for carrying out this driving method comprises a signal light source 106 for generating an address light, a control signal light, an information signal light, and a reset light, a half mirror 107 for dividing a light transmitted through a transmission line 101 from the signal light source 106 into first and second lights, a light detection circuit 102 for detecting the address and rest lights included in the second light, a synchronous driving circuit 103 for applying a predetermined voltage to a pnpn semiconductor device 201 which is the same as the device explained hereinbefore and coupled to input and output signal light lines 104 and 105.

In operation, an address light 300, a control signal light 400, an information signal light 410, and a reset light 310 are sequentially supplied from the signal light source 106 to the pnpn semiconductor device 201. When the light detection circuit 102 detects the address light 300, the synchronous driving circuit 103 generates a predetermined positive voltage to be applied to the device 201. Further, when the light detection circuit 102 detects the reset light 310, the synchronous driving circuit 103 generates a predetermined negative voltage to be applied to the device 201. In order to switch the device 201 into the ON state, the control signal light having a wavelength of 870.0 nm and a light power more than Ps is supplied from the signal light source 106 thereto in synchronization with the set pulse of the predetermined positive voltage, and consequently the current flows therethrough. The current of 90 mA flows through the device 201, while the set pulse is being applied thereto, so that it does not oscillate. When the information signal light 410 having a wavelength of 870.0 nm is supplied to the device 20, it emits an output information signal light on the output signal light line 105. Since a light power of the information signal light 410 is lower than that of the control signal light 400, the device 201 is not switched by the information signal light 410.

Figure 16A:
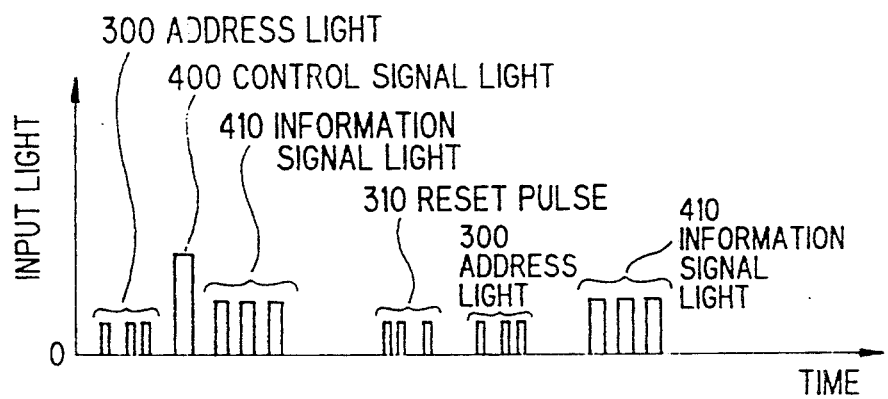
FIGS. 16A to 16D are timing charts showing operation in the sixth preferred embodiment.
Figure 16B:
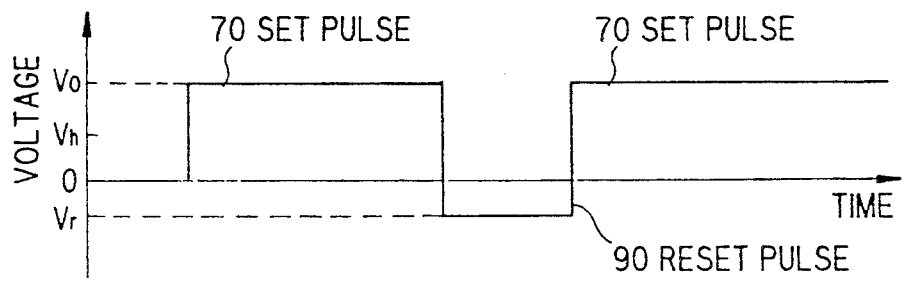
Figure 16C:
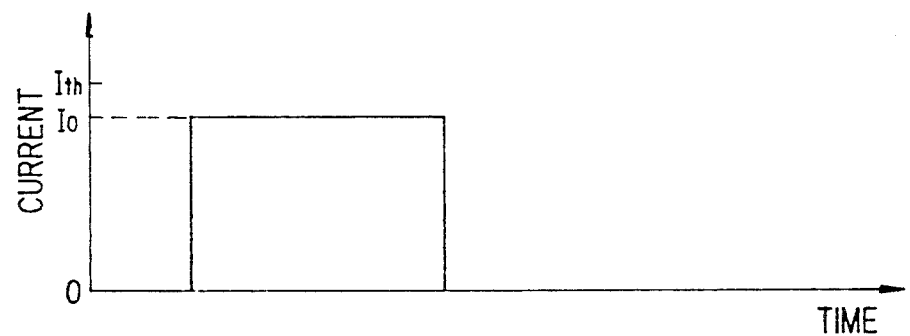
Figure 16D:
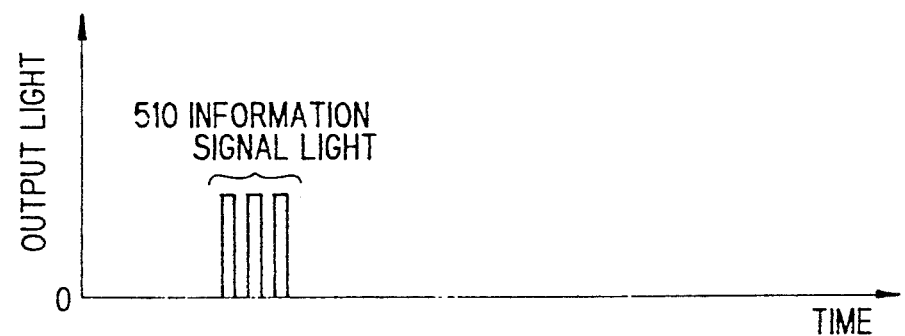

The above described operation will be again explained in FIGS. 16A to 16D. As shown in FIG. 16A, the address light 300, the control signal light 400, the information signal light 410, and the reset light 310 are sequentially applied to the pnpn semiconductor device 201. When the light detection circuit 102 detects the address light 300, the synchronous driving circuit 103 generates the set pulse 70 having a voltage $V_0$ (=4.0 V) to be applied to the device 201 as shown in FIG. 16B. When the light detection circuit 102 detects the reset light 310, the synchronous driving circuit 103 generates the reset pulse 90 having a voltage Vr (=−0.5 V) to be applied to the device 201. In order to switch the device 201 into the ON state, the control signal light 400 having a wavelength of 870.0 nm and the light power more than Ps is supplied to the device 201 in synchronization with a rising time of the set pulse 70, and consequently, the current flows therethrough as shown in FIG. 16C. The current value is 90 mA to be less than the oscillation threshold current value, so that it does not oscillate and the emitted light is very small. When the information signal light 410 having a wavelength of 870.0 nm is supplied to the device 201, it emits an output information signal light 510 having a wavelength of 870.0 nm which is the resonant wavelength, as shown in FIG. 16D. Since a light power of the input information signal light 410 is lower than that of the control signal light 400 the device is not switched by the information signal light 410 which is supplied to the device 201 turned back to the OFF state by the reset pulse 90 as shown in FIGS. 16B and 16C.

Figure 15:
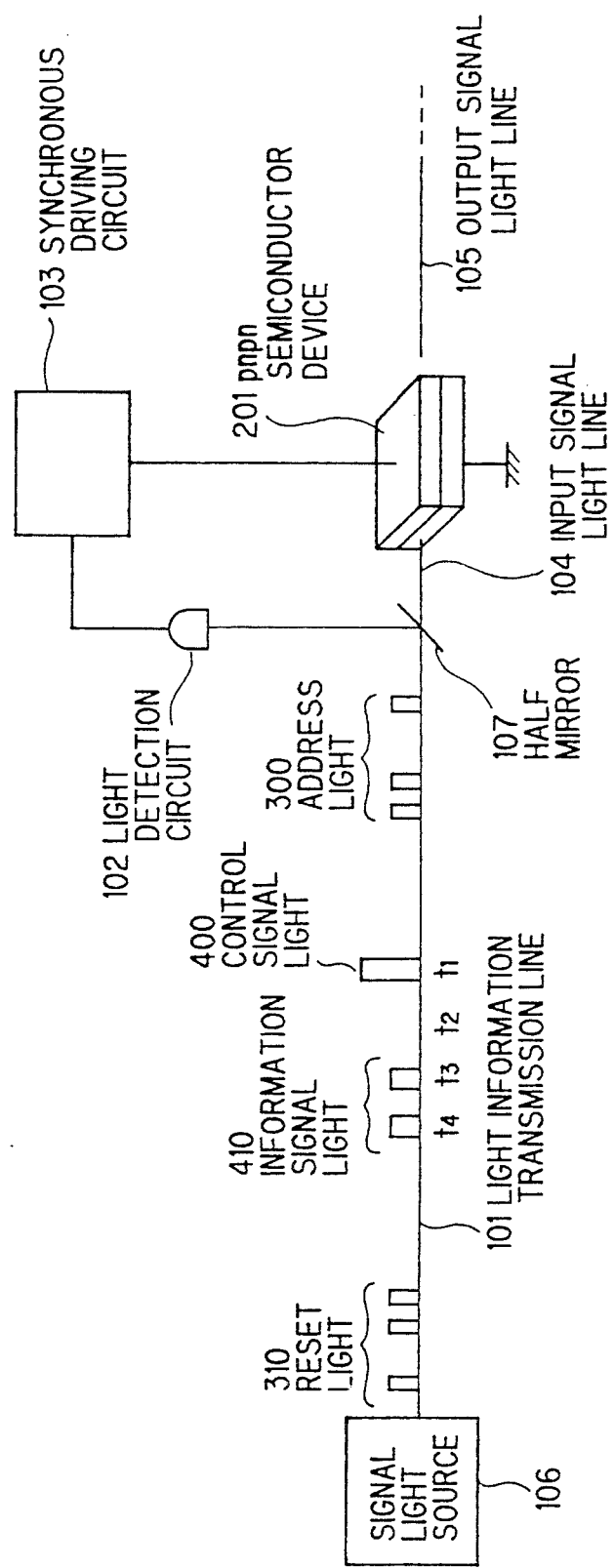
FIG. 15 is an explanatory diagram showing a driving circuit for a driving method of a pnpn semiconductor device in a sixth preferred embodiment according to the present invention.
Figure 17A:
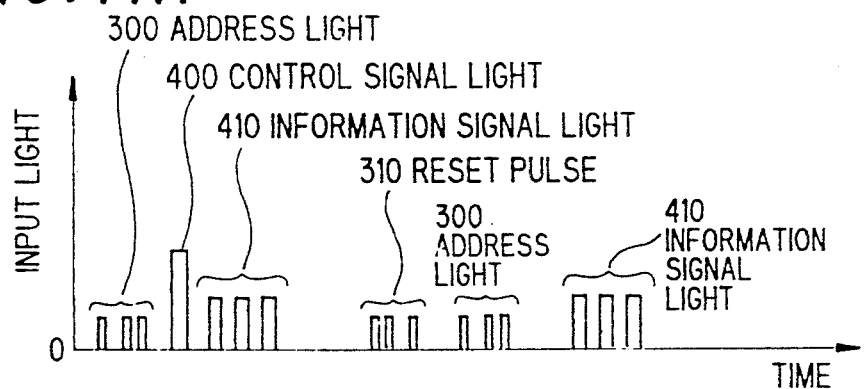
FIGS. 17A to 17D, 18A to 18D, and 19A to 19D are timing charts showing operation of a driving method of a pnpn semiconductor device in seventh to ninth preferred embodiments according to the present invention.
Figure 17B:
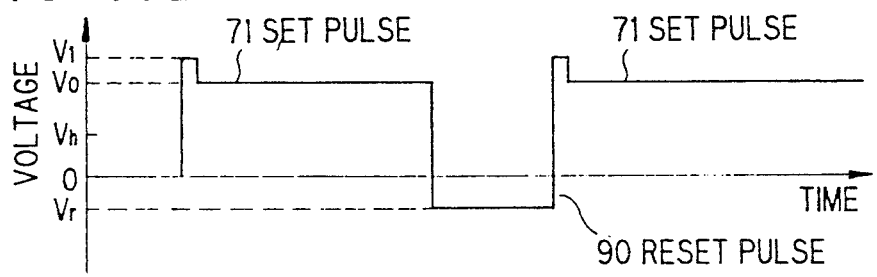
Figure 17C:
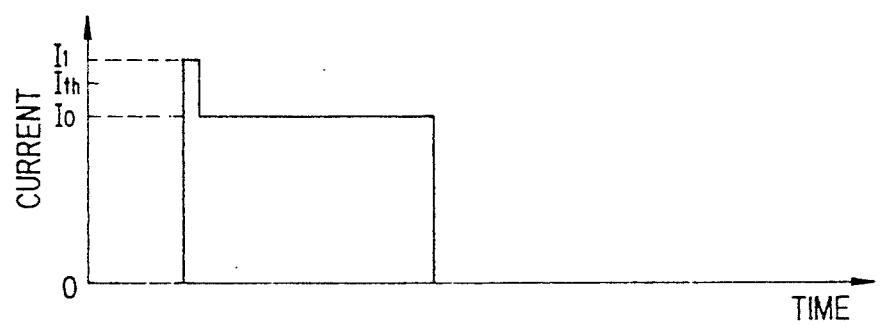
Figure 17D:
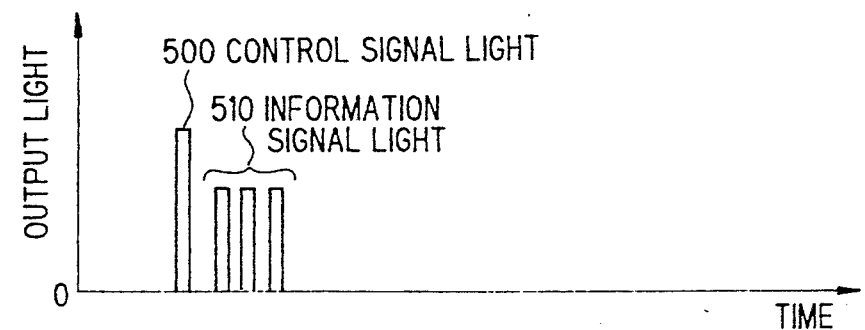

FIGS. 17A to 17D show a driving method of the seventh preferred embodiment according to the invention, wherein the apparatus shown in FIG. 15 is used. As shown in FIG. 17A, the address light 300, the control signal light 400, the information signal light 410, and the reset light 310 are sequentially supplied to the pnpn semiconductor device 201. When the light detection circuit 102 detects the address light 300, the synchronous circuit 103 generates the set pulse 71 having a voltage $V_1$ (=4.5 V) to be applied to the device 201 as shown in FIG. 17B. In order to switch the device 201 into the ON state, the control signal light 400 having a wavelength of 870.0 nm and the light power more than Ps is supplied to the device 201 in synchronization with the set pulse 71, and consequently the current $I_1$ of 110 mA flows therethrough as shown in FIG. 17C. Thus, the device 201 oscillates, since the current $I_1$ flowing therethrough is higher than the oscillation threshold current Ith (=100 mA), and emits the light output 500 of about 3 mW. Then, a voltage of the set pulse 71 is controlled to be 4.0 V. In this state, when the information signal light 410 is supplied to the device 201, the current $I_0$ of 90 mA flows therethrough. As a result, the device 201 stops the oscillation and emits the output information signal light 510 having a wavelength of 870.0 nm which is the resonant wavelength, as shown in FIG. 17D. Then, the reset light 310 is supplied from the signal light source 106 to the light detection circuit 102, so that the reset pulse 90 is applied to the device 201. As a result, the device 201 is turned back to the OFF state as shown in FIG. 17C. Thereafter, the address light 300 is again supplied to the light detection circuit 102, so that the set pulse 71 having first and second sequential voltages of 4.5 V and 4.0 V is applied to the device 201. However, the control signal light is not supplied to the device 201 at this time, so that no light is emitted therefrom, even if the information signal light 410 is supplied to the device 201.

Figure 18A:
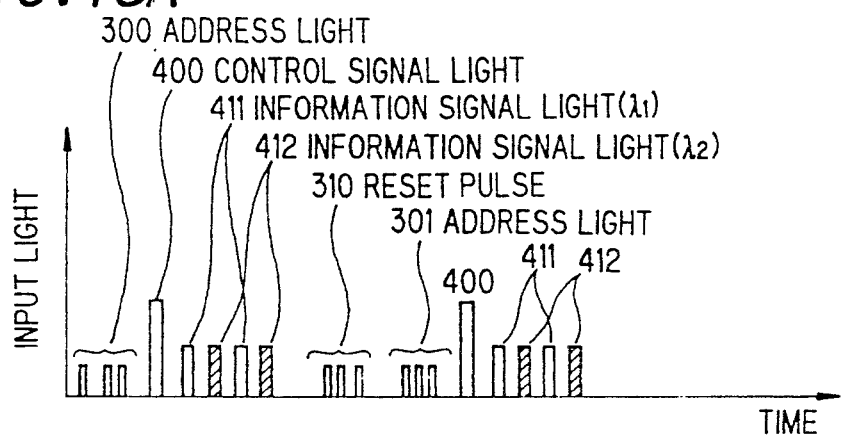
Figure 18B:
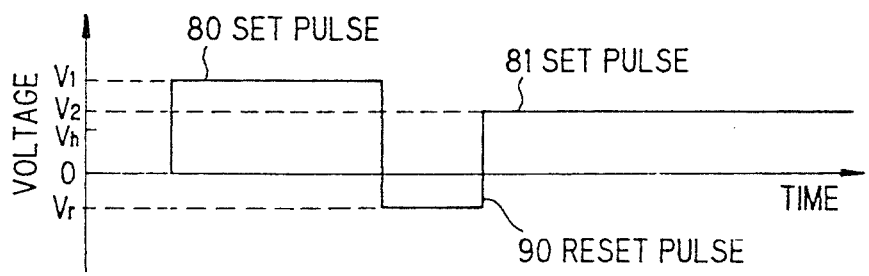
Figure 18C:
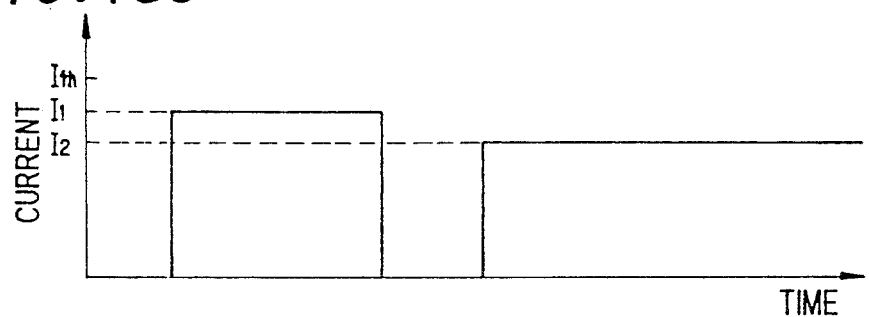
Figure 18D:
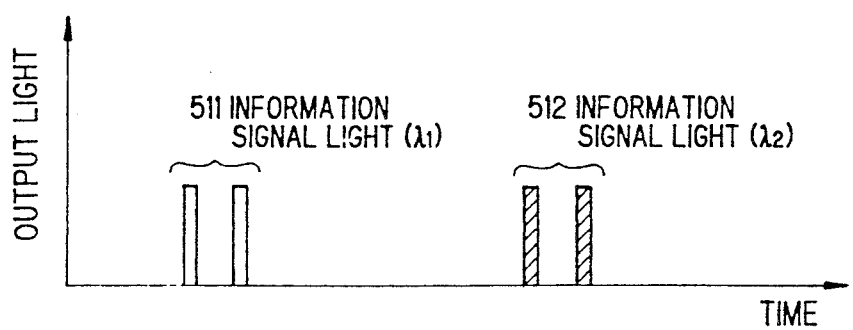
Figure 19A:
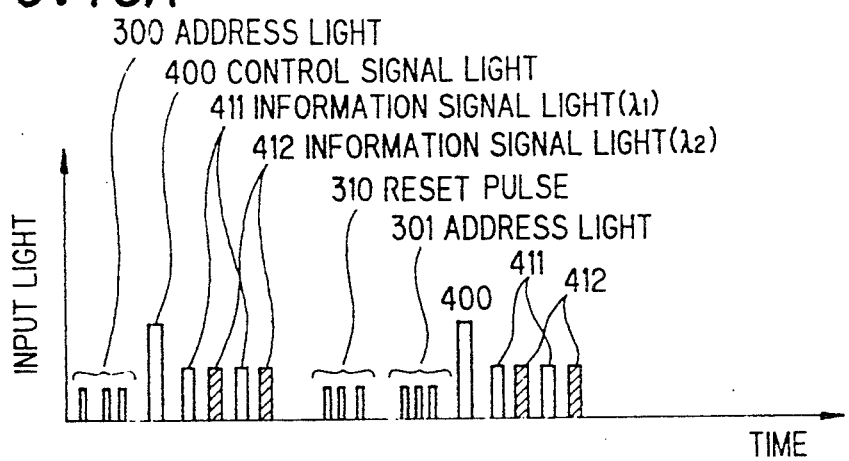
Figure 19B:
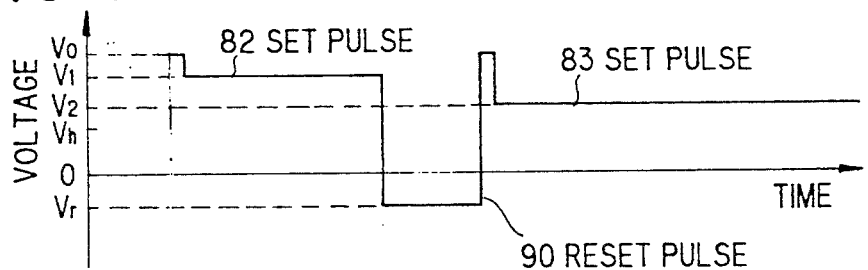
Figure 19C:
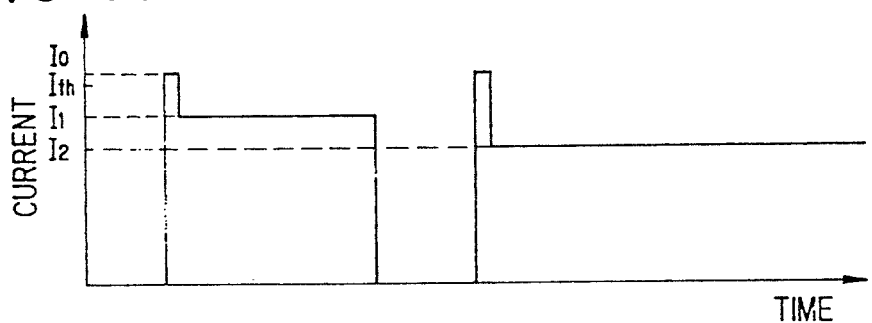
Figure 19D:
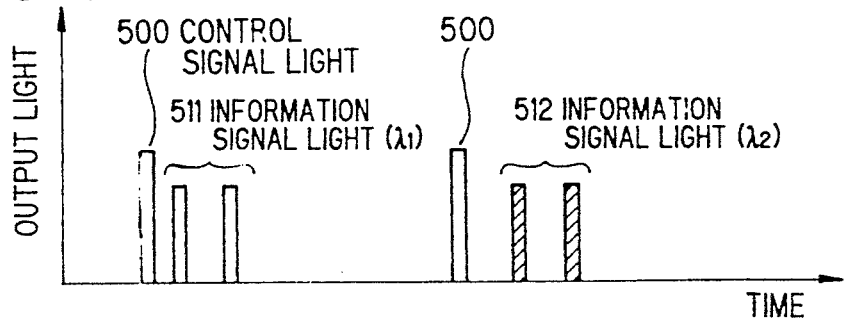

FIGS. 18A to 18D show a driving method of the eighth preferred embodiment according to the invention, wherein the apparatus shown in FIG. 15 is used. As shown in FIG. 18A, the address light 300, the control signal light 400, the information signal lights 411 and 412, and the reset light 310 are sequentially supplied to the pnpn semiconductor device 201. In this preferred embodiment, the address light 300 includes information representing a voltage value applied to the device 201. When the light detection circuit 102 detects the address light 300, the synchronous driving circuit 103 generates the set pulse 80 having a voltage $V_1$ (=4.0 V) to be applied to the device 201. When the light detection circuit 102 detects the reset light 310, the synchronous driving circuit 103 generates the reset pulse 90 having a voltage Vr (=−0.5 V) to be applied to the device. After the detection of the reset light 310, when the light detection circuit 102 detects the address light 301, the synchronous circuit 103 generates the set pulse 81 having a voltage $V_2$ (=3.9 V) to be applied to the device 201. When the set pulse 80 is applied to the device 201, a current $I_1$ or 90 mA which is smaller than the threshold value of 100 mA flows through the device 201 which is switched into the ON state, so that an output information signal light 511 having a wavelength $\lambda_1$ of 870.0 nm is emitted from the device 201, to which the information signal light 411 having a wavelength $\lambda_1$ of 870.0 nm and the information signal light 412 having a wavelength $\lambda_2$ of 870.2 nm are supplied. On the other hand, when the set pulse 81 is applied to the device 201, a current $I_2$ of 88 mA flows through the device which is switched into the ON state subsequently to the OFF state caused by the reset pulse 90, so that only an output information signal light 512 having a wavelength $\lambda_2$ of 870.2 nm corresponding to the information signal light 412 is emitted from the device 201.

FIGS. 19A to 19D show a driving method of a ninth preferred embodiment according to the invention, wherein the apparatus shown in FIG. 15 is used. In this preferred embodiment, operation is almost the same as that in the eighth preferred embodiment except for the difference which is found in that the set pulse 82 having a first voltage $V_0$ of 4.5 V and a second voltage $V_1$ of 4.0 V, and the set pulse 83 having a first voltage $V_0$ of 4.5 V and a second voltage $V_2$ of 3.9 V are applied to the device 201, respectively. When the set pulses 82 and 83 have the first voltage $V_0$, a current $I_0$ of 110 mA which is larger than the threshold current Ith of 100 mA flows through the device 201 operating in the oscillation mode under the receipt of the control signal light 400, so that the output control signal lights 500 are emitted from the device 201. The output information signal lights 511 and 512 having a wavelength $\lambda_1$ of 870.0 nm and a wavelength $\lambda_2$ of 870.2 nm are obtained dependent on the voltage values $V_1$ and $V_2$ of the set pulses 82 and 83 in the same manner as in the eighth preferred embodiment.

Figure 20:
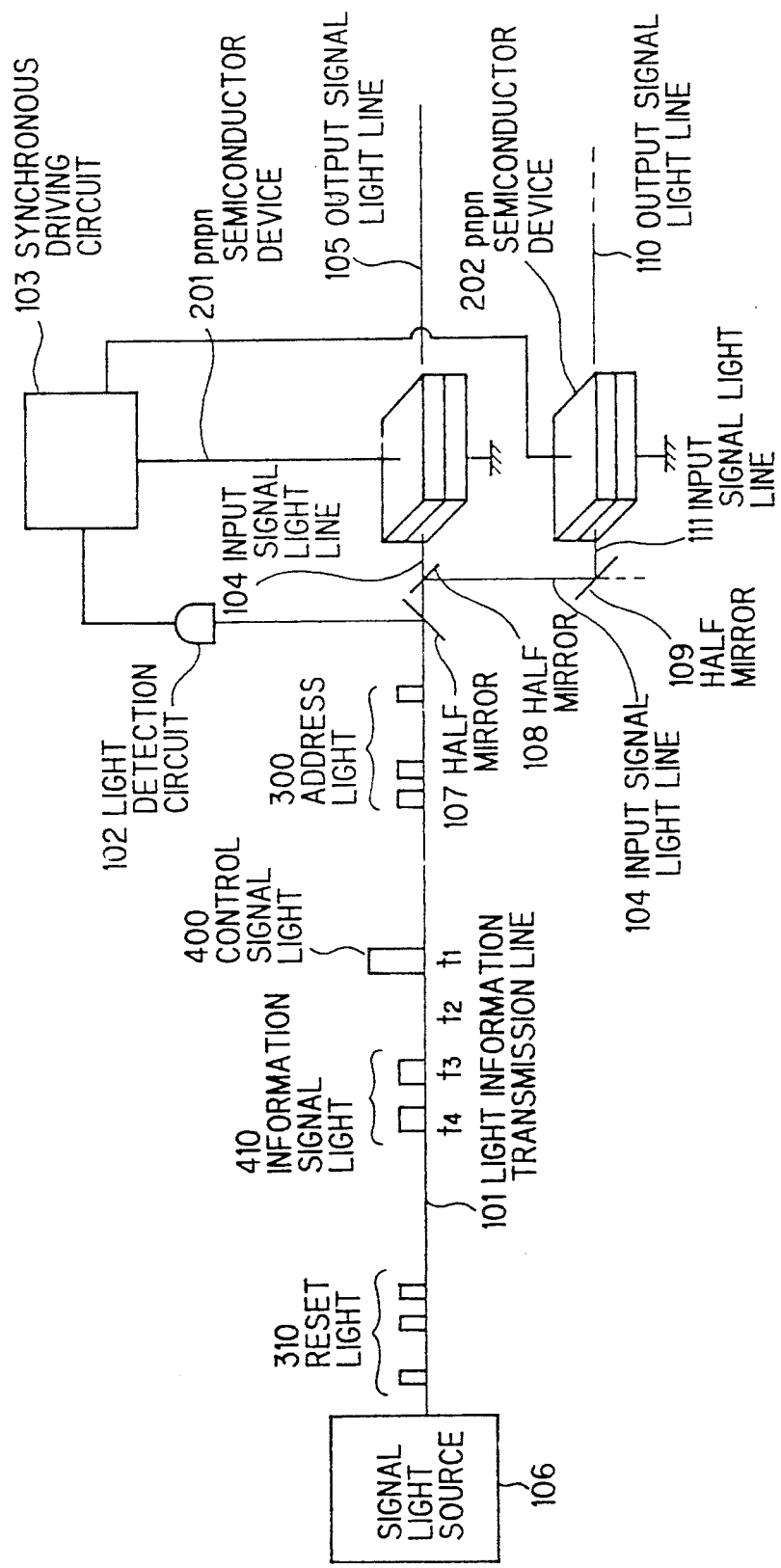
FIG. 20 is an explanatory diagram showing a driving circuit for a driving method of a pnpn semiconductor device in a tenth preferred embodiment according to the present invention.

FIG. 20 shows a driving method of a tenth preferred embodiment according to the present invention. This driving method is carried out in an apparatus which comprises a signal light source 106 for generating an address light, a control signal light, an information signal light, and a reset light, half mirrors 107, 108 and 109 for dividing an input light into two output lights, respectively, a light detection circuit 102 for detecting address and reset lights included in the divided light of the half mirror 107, and a synchronous driving circuit 103 for applying set pulses to pnpn semiconductor devices 201 and 202, respectively.

Figure 21A:
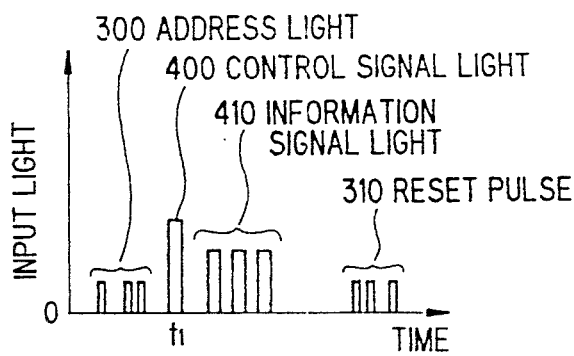
FIGS. 21A to 21H are timing charts showing operation in the tenth preferred embodiment.
Figure 21E:
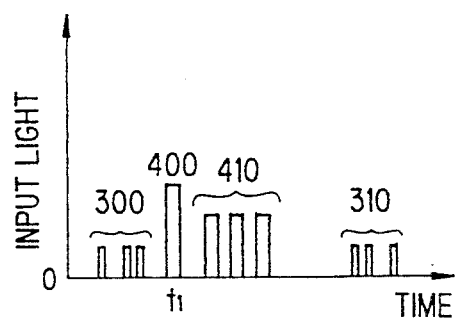
Figure 21B:
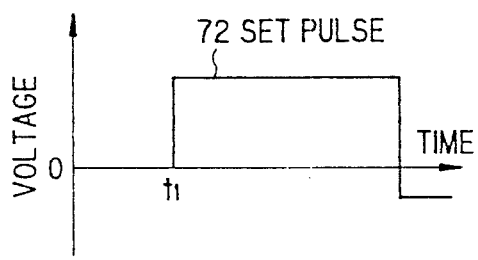
Figure 21F:
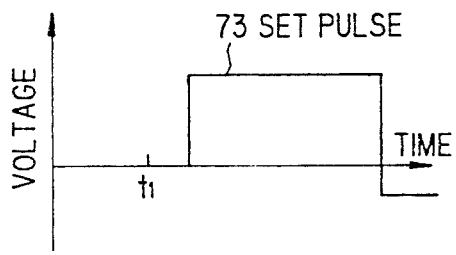
Figure 21C:
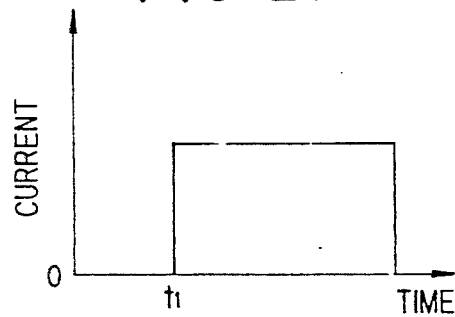
Figure 21G:
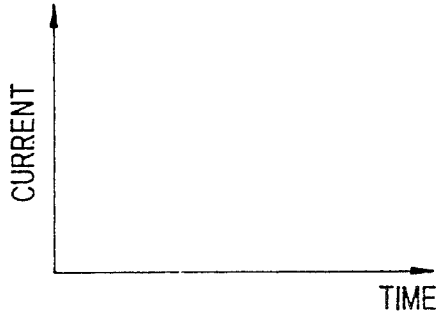
Figure 21D:
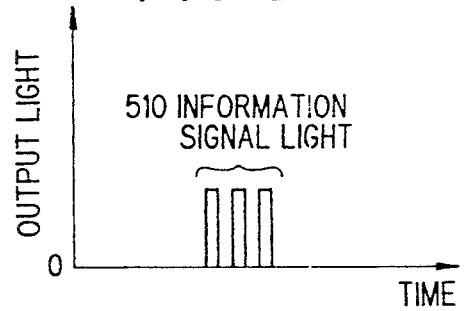
Figure 21H:
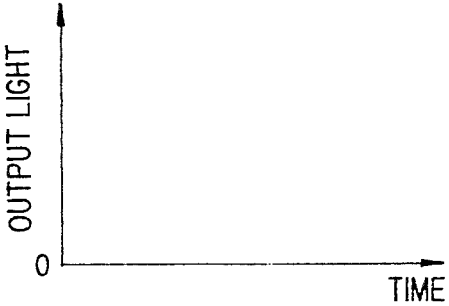

In operation, the address light 300, the control signal light 400, the information signal light 410, and the reset light 310 are sequentially applied to the pnpn semiconductor devices 201 and 202 as shown in FIGS. 21A and 21E. When the light detection circuit 102 detects the address light 300, the synchronous circuit 103 generates the set pulse 72 having a voltage $V_1$ (=4.0 V) to be applied to the device 201. A rising time of the set pulse 72 is synchronous with the control signal light 400 having a wavelength of 870.0 nm and a light power of more than the predetermined power Ps as shown in FIG. 21B at the timing $t_1$, so that the device 201 is switched into the ON state to provide a current of 90 mA flowing therethrough as shown in FIG. 21C. Then, when the information signal light 410 is supplied to the device 201, the output information signal light 510 is emitted from the device 201 which is not in the oscillation state, but in the ON state, as shown in FIG. 21D. On the other hand, a rising time of the set pulse 73 applied to the device 202 is behind the timing $t_1$, such that the control signal light 400 is not synchronized with any portion of the set pulse 73. As a result, no switching-on of the device occurs, and no output information signal light is obtained as shown in FIGS. 21E to 21H.

Thus, according to the present invention, since control signal light and information signal light are time-sequentially supplied to a pnpn semiconductor device, the operation speed of driving the pnpn semiconductor device is improved. In addition, a light power of the input light can be kept relatively low. Moreover, a driving circuit can be simply constructed, when the information signal is selectively transmitted to a pnpn semiconductor device of the next stage. Furthermore, a transmission capacity of information can be easily increased by use of information signal lights having multiplexed wavelengths for a pnpn semiconductor device and selecting an information signal light having a desired wavelength based on an applied voltage.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A driving method for a pnpn semiconductor device comprising an anode layer which consists of a p type semiconductor, a cathode layer which consists of an n-type semiconductor, and a gate layer located between said anode layer and said cathode layer, said gate layer comprising a plurality of semiconductor layers and being narrower in forbidden bandgap than said anode layer and said cathode layer, and said pnpn semiconductor device emitting a stimulated emission light when said pnpn semiconductor device is set in a low impedance state, said driving method comprising:

applying a voltage higher than a holding voltage of said pnpn semiconductor device to an anode electrode thereof to apply an electric field across said anode and cathode layers;

supplying a control signal light to said pnpn semiconductor device to set said pnpn semiconductor device into a predetermined operation state; and supplying an information signal light to said pnpn semiconductor device;

said control signal light and said information signal light being time-sequentially supplied to said pnpn semiconductor device under the application of said voltage thereto, whereby said pnpn semiconductor device operates responsive to said information signal light.

2. A driving method according to claim 1, wherein said voltage applying step comprises:

applying a first voltage higher than said holding voltage and a second voltage lower than said first voltage and higher than said holding voltage to said anode electrode;

said control signal supplying step being carried out under the application of said first voltage, and said information signal light supplying step being carried out under the application of said second voltage.

3. A driving method according to claim 1, further comprising:

providing a plurality of pnpn semiconductor devices as said pnpn semiconductor device;

wherein said voltage applying step comprises:

applying a first voltage higher than said holding voltage and a second voltage higher than said holding voltage to anode electrodes of said plurality of said pnpn semiconductor devices;

said control signal supplying step being carried out under said first voltage applied at different timings to said anode electrodes, and said information signal light supplying step being carried out under the application of said second voltage.

4. A driving method according to claim 1, wherein said information signal light supplying step comprises:

supplying a wavelength multiplexed information signal light to said pnpn semiconductor device; and selecting an information signal light having a predetermined wavelength from said wavelength multiplexed information signal light.

5. A driving method according to claim 2, wherein said information signal light supplying step comprises:

supplying a wavelength multiplexed information signal light to said pnpn semiconductor device; and selecting an information signal light having a predetermined wavelength from said wavelength multiplexed information signal light.

6. A driving apparatus for a pnpn semiconductor device comprising:

a light information transmission input line to be branched into a plurality of lines;

a light detection circuit coupled to at least one of said plurality of lines;

a pnpn semiconductor device coupled to one of said plurality of lines except for a line to which said light detection circuit is coupled;

a synchronous driving circuit which is coupled to said light detection circuit; and a light information transmission output line coupled to said pnpn semiconductor device;

wherein said synchronous driving circuit applies a voltage to said pnpn semiconductor device to be driven by receiving a light supplied from said information transmission input line, when said light detection circuit detects an address of said pnpn semiconductor device included in a light supplied from said light information transmission input line.

7. A driving apparatus according to claim 6, wherein said pnpn semiconductor device comprises a plurality of pnpn semiconductor devices each coupled to a corresponding one of said plurality of lines;

said light information transmission output line comprises a plurality of light information transmission output lines each coupled to a corresponding one of said plurality of said pnpn semiconductor devices; and said synchronous driving circuit applies a voltage to said plurality of said pnpn semiconductor devices time-sequentially to be driven in accordance with addresses detected by said light detection circuit.

8. A driving apparatus according to claims 6 or 7, wherein said pnpn semiconductor device comprises an anode layer which consists of a p-type semiconductor, a cathode layer which consists of a n-type semiconductor, and a gate layer located between said anode layer and said cathode layer, said gate layer comprising a plurality of semiconductor layers and being narrower in forbidden bandgap than said anode layer and said cathode layer, and said pnpn semiconductor device emitting a stimulated emission light, when said pnpn semiconductor device is set in a low impedance state.

9. A dividing apparatus according to claim 6 or 7 further comprising:

a signal light source for generating an address light having information of a timing at which a voltage is applied to said pnpn semiconductor device, a control signal light setting said pnpn semiconductor device into a predetermined operation state, an information signal light having information to be transmitted on a transmission line, and a reset light resetting said pnpn semiconductor device into an OFF state;

wherein said synchronous driving circuit applies a positive voltage to said pnpn semiconductor device at a timing determined by information of said address light detected by said light detection circuit, and a negative voltage thereto at a timing determined by information of said reset light detected by said light detection circuit.

10. A driving apparatus according to claim 9, wherein said signal light source generates said address light including information of a timing at which a positive voltage is applied to said pnpn semiconductor device by said synchronous driving circuit and of a value of said positive voltage, and said information signal light being a wavelength multiplexed light from which an information signal light having a predetermined wavelength is selected dependent on said value of said positive voltage applied to said pnpn semiconductor device.

11. A driving apparatus according to claim 9, wherein said synchronous driving circuit applies a first value of a voltage to said pnpn semiconductor device in synchronization with said control signal light, and a second value of a voltage which is lower than said first value of a voltage thereto in synchronization with said information signal light.

* * * * *

UNITED STATES PATENT AND TRADEMARK OFFICE
CERTIFICATE OF CORRECTION

PATENT NO. : 5,153,758
DATED : October 6, 1992
INVENTOR(S) : Yoshiharu Toshiro et al.

It is certified that error appears in the above-identified patent and that said Letters Patent is hereby corrected as shown below:

Col. 4, line 55, after "pJ,", insert --Vb=4.5 V,--.

Col. 16, line 4, delete "dividing" and insert --driving--.

Signed and Sealed this

Thirtieth Day of November, 1993

Attest:

BRUCE LEHMAN

Attesting Officer   Commissioner of Patents and Trademarks